(12) United States Patent
Kuramoto et al.

(10) Patent No.: US 6,642,546 B2
(45) Date of Patent: *Nov. 4, 2003

(54) NITRIDE BASED SEMICONDUCTOR DEVICE AND METHOD OF FORMING THE SAME

(75) Inventors: Masaru Kuramoto, Tokyo (JP); Atsushi Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 64 days.

This patent is subject to a terminal disclaimer.

(21) Appl. No.: 09/810,546

(22) Filed: Mar. 19, 2001

(65) Prior Publication Data

US 2001/0030316 A1 Oct. 18, 2001

(30) Foreign Application Priority Data

Mar. 17, 2000 (JP) .......................................... 2000-076618
Sep. 1, 2000 (JP) .......................................... 2000-265803

(51) Int. Cl.[7] .............................................. H01L 29/22
(52) U.S. Cl. ............................ 257/94; 257/96; 257/103
(58) Field of Search ............................ 257/103, 94, 96; 372/44

(56) References Cited

U.S. PATENT DOCUMENTS

2002/0030200 A1 * 3/2002 Yamaguchi et al.

FOREIGN PATENT DOCUMENTS

| JP | A 10-12969 | 1/1998 |
| JP | 11-307866 | 11/1999 |
| JP | 11-340580 | 12/1999 |
| JP | A 2000-58462 | 2/2000 |

* cited by examiner

*Primary Examiner*—Sara Crane
(74) *Attorney, Agent, or Firm*—Young & Thompson

(57) ABSTRACT

The present invention provides a semiconductor device comprising: a base layer made of a gallium nitride-based material; a cladding layer extending over the base layer; and an active layer extending over the cladding layer, and the active layer including at least a photo-luminescent layer of $In_xAl_yGa_{1-x-y}N$ (0<x<1, 0≦y≦0.2), wherein a standard deviation $\Delta x$ of a microscopic fluctuation in an indium composition of the photo-luminescent layer is not more than 0.067, or wherein a standard deviation $\sigma$ of a microscopic fluctuation in a band gap energy of the photo-luminescent layer is not more than 40 meV, or wherein a differential gain "dg/dn" of the active layer satisfies $dg/dn \geq 1.0 \times 10^{-20}$ $(m^2)$.

64 Claims, 16 Drawing Sheets ammonium gas partial pressure (hPa)

standard deviation σ of fluctuation of band gap energy (meV)

standard deviation σ of fluctuation of band gap energy (meV)

990nm

US 6,642,546 B2

NITRIDE BASED SEMICONDUCTOR DEVICE AND METHOD OF FORMING THE SAME

BACKGROUND OF THE INVENTION

The present invention relates to a semiconductor device and a method of forming the same, and more particularly to a life-time improved gallium nitride based semiconductor laser diode with a gallium nitride based active layer and a method of forming the same.

A nitride semiconductor layer of a luminescent device has many through dislocations. For this reason, a design concept for a layered-structure of the nitride based semiconductor device is largely different from the other semiconductor devices. Normally, it is preferable that the active layer of the semiconductor laser diode is uniform in compositional profile and in energy band gap profile. If the active layer of the semiconductor laser diode is not uniform in compositional profile and in energy band gap profile, then the photoluminescent efficiency is dropped, resulting in an undesired multiple wavelength laser emission. In the nitride semiconductor laser diode, however, the active layer has many defects. Carriers are likely to be captured by the defects and non-luminescence recombination is likely to appear at the defects. In order to avoid this problem, it is effective to form in-plane fluctuations of the potential of the active layer, so that the carriers are localized in the potential valleys provided by the potential fluctuations. If the carriers are localized in the potential valleys, then it unlikely appears that the carriers are captured by the defects and non-luminescence recombination appears at the defects. Differently from the other semiconductor devices, a non-uniform compositional profile of the active layer is preferable for the nitride semiconductor laser diode.

In general, the active layer of the gallium nitride based semiconductor device is made of InAlGaN which is hard to be grown in amorphous state, wherein a phase separation between InN and GaN or AlN is likely to appear. For this reason, the InAlGaN active layer is non-uniform in indium composition. This phase separation is naturally formed, and the in-plane potential fluctuation is formed in the active layer, thereby suppressing the non-luminescent recombination of carriers, resulting in an improvement in the photoluminescent efficiency and in the reduction of the threshold voltage.

The above described technical matters are disclosed in Japanese laid-open patent publication No. 10-12969. This Japanese laid-open patent publication also describes as follows. InGaN is hard to be grown in amorphous state and a high tendency of phase separation of InN and GaN is shown. The in-plane non-uniformity in the indium composition of the quantum well layer causes that the quantum well layer is non-uniform in band gap profile, wherein a high indium composition region has a low potential energy and a low indium composition region has a high potential energy. Electrons and holes are localized in the high indium composition region having a low potential energy, whereby localized excitons are formed. The localized excitons drops the threshold value of the laser diode and increases the output.

The following similar technical matters are also disclosed in Applied Physics Letters, vol. 71, p. 2346, 1997. The INGaN is hard to be grown in amorphous state due to phase separation. The InN composition is fluctuated in the InGaN quantum well layer. Quantum disks or quantum dots restrict motion of excitons, whereby non-luminescent recombination is suppressed. A large fluctuation in the indium composition is effective to suppress the non-luminescent recombination and improve the luminescent efficiency.

The following similar technical matters are also disclosed in Applied Physics Letters, vol. 70, p. 983, 1997. The indium compositional fluctuation of the InGaN quantum well structure is observed on the basis of a cross sectioned transmission electron microscope photograph. Localization of exceptions suppresses the non-luminescent path, whereby a high quantum efficiency of the InGaN based laser diode can be obtained.

In case of the semiconductor laser diode having the InGaN quantum well layer, the phase separation of InN and GaN is likely to be caused in the InGaN layer. This phase separation causes the indium composition fluctuation which improve the luminescent efficiency, the threshold value and the laser output.

The indium compositional fluctuation in the active layer causes the fluctuation or non-uniformity in the energy band gap profile in the active layer, whereby a multiple wavelength laser emission is caused and a variation in photoluminescent wavelength distribution due to injection current is caused.

In Japanese laid-open patent publication No. 11-340580, it is discussed that in order to avoid the above problem, it is effective to realize the uniformity in composition of the active layer, which is measured by a photo-luminescence peak wavelength distribution. The compositional uniformity is suppressed within ±0.03 to obtain a photo-luminescence peak wavelength distribution of not more than 150 meV, thereby suppressing the multiple wavelength laser emission.

In recent years, the requirement for improving the lifetime of the nitride based semiconductor laser diode has been on the increase. If the nitride based semiconductor laser diode is applied to a light source for the next generation optical storage device such as digital video disk, then at least 5000 hours or longer life-time is necessary, wherein the life-time is measured by an APC examination at 70° C. and 30 mW.

In Physica Status Solidi (a) vol. 176, p. 15, 1999, it is disclosed that reduction in dislocation density of substrate is effective for improving life-time of the laser diode. The laser diode uses a substrate with a reduced dislocation density and AlGaN/GaN modulation-doped cladding layer. If the APC examination is carried out at room temperature and 2 mW, then the life-time of not less than 10000 hours can be obtained. If, however, the APC examination is carried out at 60° C. and 30 mW, then the obtained life-time is only 400 hours. This conventional laser diode does not satisfy the above requirement.

A recently developed method "facet-initiated epitaxial lateral growth" is disclosed in Applied Sysics, vol. 68–7, 1999, pp. 774–779. This method is effective to obtain a GaN substrate with a largely reduced dislocation density. FIG. 1 is a cross sectional elevation view illustrative of a conventional gallium nitride based semiconductor laser diode over an n-GaN substrate with a low surface dislocation density which is prepared by the facet-initiated epitaxial lateral growth. An n-type cladding layer 102 is provided on a top surface of the n-GaN substrate 101, wherein the n-type cladding layer 102 comprises an Si-doped n-type $Al_{0.1}Ga_{0.9}N$ layer having a silicon impurity concentration of $4\times10^{17}$ cm$^{-3}$ and a thickness of 1.2 micrometers. An n-type optical confinement layer 103 is provided on a top surface of the n-type cladding layer 102, wherein the n-type optical confinement layer 103 comprises an Si-doped n-type GaN layer having a silicon impurity concentration of $4\times10^{17}$ cm$^{-3}$ and a thickness of 0.1 micrometer. A multiple quantum well layer 104 is provided on a top surface of the n-type optical confinement layer 103, wherein the multiple quantum well layer 104 comprises two In$_{0.2}$Ga$_{0.8}$N well layers having a thickness of 4 nanometers and Si-doped In$_{0.05}$Ga$_{0.95}$N potential barrier layers having a silicon impurity concentration of $5\times10^{18}$ cm$^{-3}$ and a thickness of 6 micrometers. A cap layer 105 is provided on a top surface of the multiple quantum well layer 104, wherein the cap layer 105 comprises an Mg-doped p-type Al$_{0.2}$Ga$_{0.8}$N layer. A p-type optical confinement layer 106 is provided on a top surface of the cap layer 105, wherein the p-type optical confinement layer 106 comprises an Mg-doped p-type GaN layer having a magnesium impurity concentration of $2\times10^{17}$ $cm^{-3}$ and a thickness oil 0.1 micrometer. A p-type cladding layer 107 is provided on a top surface of the p-type optical confinement layer 106, wherein the p-type cladding layer 107 comprises an Mg-doped p-type Al$_{0.1}$Ga$_{0.9}$N layer having a magnesium impurity concentration of $2\times10^{17}$ cm$^{-3}$ and a thickness of 0.5 micrometers. A p-type contact layer 108 is provided on a top surface of the p-type cladding layer 107, wherein the p-type contact layer 108 comprises an Mg-doped p-type GaN layer having a magnesium impurity concentration of $2\times10^{17}$ cm$^{-3}$ and a thickness of 0.1 micrometer. Those layers 102, 103, 104, 105, 106, 107, and 108 were formed by a low pressure metal organic vapor phase epitaxy method under a pressure of 200 hPa. A partial pressure of the ammonium gas for nitrogen source was maintained at 147 hPa. TMG was used for the Ga source material. TMA was used for the Al source material. TMI was used for the In source material. The growth temperature was maintained at 1050° C. except when the InGaN multiple quantum well active layer 104 was grown. In the growth of the InGaN multiple quantum well active layer 104, the growth temperature was maintained at 780° C. A dry etching process was then carried out to selectively etch the p-type cladding layer 107 and the p-type contact layer 108 thereby forming a mesa structure 109. A silicon dioxide film 110 was formed on the mesa structure 109 and the upper surfaces of the p-type contact layer 108. The silicon dioxide film 110 was selectively removed from the top surface of the mesa structure 109 by use of an exposure technique, whereby the top surface of the p-type contact layer 108 was shown and a ridged structure was formed. An n-type electrode 111 was formed on a bottom surface of the substrate 101, wherein the n-type electrode 111 comprises laminations of a titanium layer and an aluminum layer. A p-type electrode 112 was formed on a top surface of the p-type contact layer 108, wherein the p-type electrode 112 comprises laminations of a nickel layer and a gold layer. The above structure was then cleaved to form first and second facets. The first facet was then coated with a highly reflective coat of a reflectance factor of 95%, wherein the highly reflective coat comprises laminations of titanium dioxide film and silicon dioxide The obtained threshold current density was 3.7 kA/cm$^2$, and the threshold voltage was 4.7V. The APC examination to the laser diode was carried out at 70° C. and 30 meV The averaged life-time was 200 hours.

The conventional nitride based semiconductor laser diodes do not satisfy the requirement for not less than 5000 hours, when the APC examination to the laser diode was carried out at 70° C. and 30 meV In the above circumstances, it had been required to develop a novel nitride based semiconductor device free from the above problem.

SUMMARY OF THE INVENTION

Accordingly, it is an object of the present invention to provide a novel nitride based semiconductor device free from the above problems.

It is a further object of the present invention to provide a novel nitride based semiconductor laser diode improved in life-time under high temperature and high output conditions.

It is a still further object of the present invention to provide a novel nitride based semiconductor laser diode with a high photo-luminescent efficiency.

It is yet a further object of the present invention to provide a novel method of forming a novel nitride based semiconductor device free from the above problems.

It is still more object of the present invention to provide a novel method of forming a novel nitride based semiconductor device improved in life-time under high temperature and high output conditions.

It is yet more object of the present invention to provide a novel method of forming a novel nitride based semiconductor device with a high photo-luminescent efficiency.

The first present invention provides a semiconductor device comprising: a base layer made of a gallium nitride-based material; a cladding layer extending over the base layer; and an active layer extending over the cladding layer, and the active layer including at least a photo-luminescent layer of In$_x$Al$_y$Ga$_{1-x-y}$N (0<x<1, 0≦y≦0.2), wherein a standard deviation Δx of a microscopic fluctuation in an indium composition of the photo-luminescent layer is not more than 0.067.

The second present invention provides a semiconductor device comprising: a base layer made of a gallium nitride-based material; a cladding layer extending over the base layer; and an active layer extending over the cladding layer, and the active layer including at least a photo-luminescent layer of In$_x$Al$_y$Ga$_{1-x-y}$N (0<x<1, 0≦y≦0.2), wherein a standard deviation σ of a microscopic fluctuation in a band gap energy of the photo-luminescent layer is not more than 40 meV.

The third present invention provides a semiconductor device comprising a base layer made of a gallium nitride-based material; a cladding layer extending over the base layer; and an active layer extending over the cladding layer, and the active layer including at least a photo-luminescent layer of In$_x$Al$_y$Ga$_{1-x-y}$N 0<x<1, 0≦y≦0.2), wherein a differential gain "dg/dn" of the active layer satisfies dg/dn≧$1.0\times10^{-20}$ (m$^2$).

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
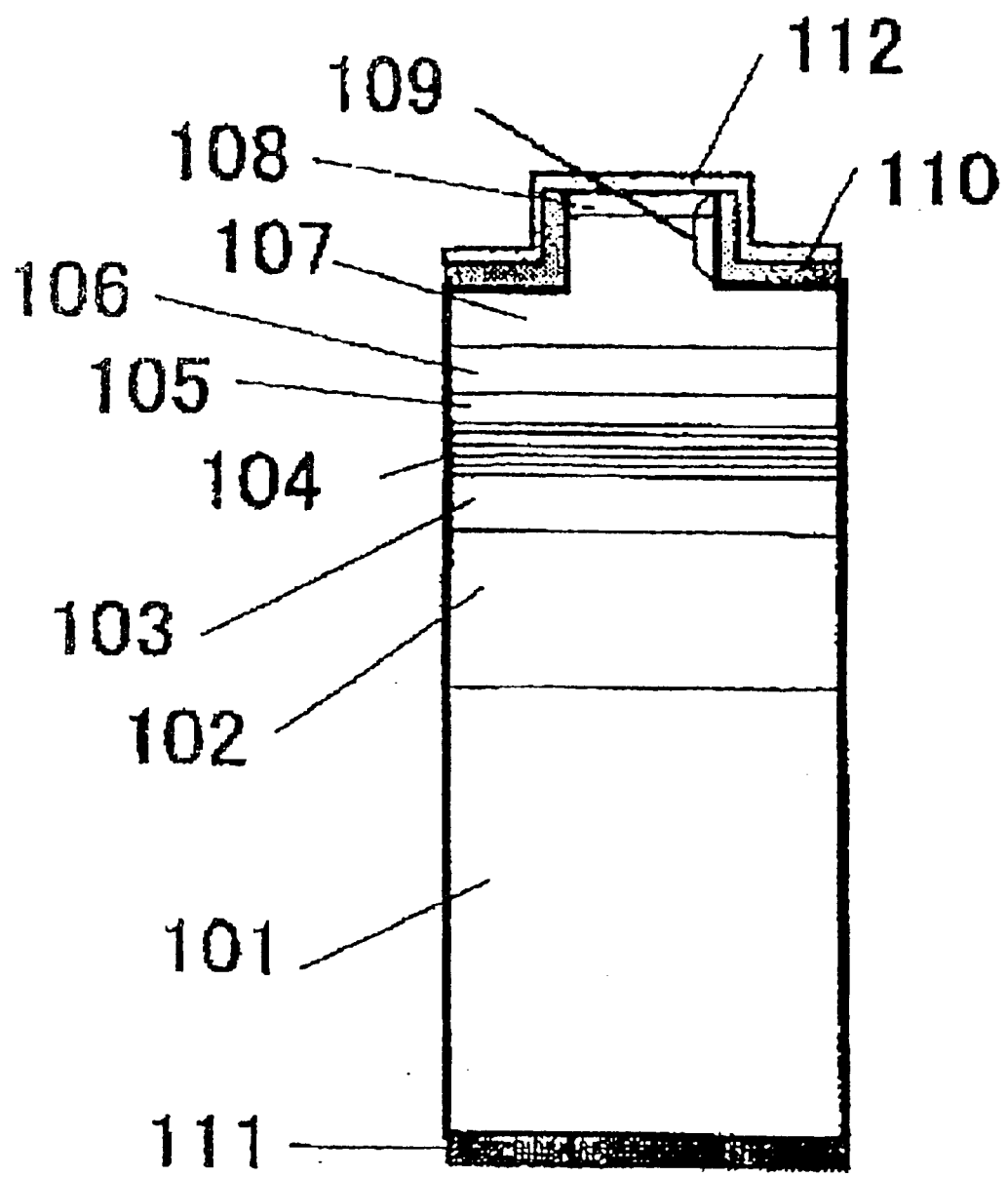
FIG. 1 is a cross sectional elevation view illustrative of a conventional gallium nitride based semiconductor laser diode over an n-GaN substrate with a low surface dislocation density.

Throughout the present specification, the word "fluctuation in indium composition" means a position-dependent fluctuation possessed by a spatial distribution in indium composition, which corresponds to a position-dependent variation in indium composition. The word "fluctuation in band gap energy" means a position-dependent fluctuation possessed by a spatial distribution in band gap energy, which corresponds to a position-dependent variation in band gap energy. The word "microscopic fluctuation" means a position-dependent fluctuation in a microscopic space which is defined by the sub-micron or smaller order scale which is less than 1 micrometer scale. The word "macroscopic fluctuation" means a position-dependent fluctuation in a macroscopic space which is defined by 1 micron or larger order scale. The "macroscopic fluctuation" is measurable by a micro-photo-luminescence measurement method with a beam spot diameter of not less than 1 micrometer. The "microscopic fluctuation" is hard to be measured by the micro-photo-luminescence measurement method with the beam spot diameter of not less than 1 micrometer. Further, the words "photo-luminescence layer" and "photo-luminescent layer" mean the layer which is included in the active layer and which allows an inverted population, thereby to generate a certain gain. If the active layer comprises a quantum well structure, one or more quantum well layers correspond to the photo-luminescent layers. If the active layer has a multiple quantum well structure, then the fluctuation means a fluctuation existing in all quantum well layers. If the active layer is free of the quantum well structure, then the active layer might generally correspond to the photo-luminescent layer.

The first present invention provides a semiconductor device comprising: a base layer made of a gallium nitride-based material; a cladding layer extending over the base layer; and an active layer extending over the cladding layer, and the active layer including at least a photo-luminescent layer of $In_xAl_yGa_{1-x-y}N$ (0<x<1, 0≦y≦0.2), wherein a standard deviation Δx of a microscopic fluctuation in an indium composition of the photo-luminescent layer is not more than 0.067.

It is preferable that the standard deviation Δx of the microscopic fluctuation in the indium composition of the photo-luminescent layer is not more than 0.04.

It is preferable that a standard deviation σ of a microscopic fluctuation in a band gap energy of the photo-luminescent layer is not more than 40 meV. It is further preferable that the standard deviation σ of the microscopic fluctuation in the band gap energy of the photo-luminescent layer is not more than 30 meV.

It is also preferable that a differential gain "dg/dn" of the active layer satisfies dg/dn≧1.0×10⁻²⁰ $(m^2)$. It is further preferable that the differential gain "dg/dn" of the active layer satisfies dg/dn≧1.4×10⁻²⁰ $(m^2)$.

It is also preferable that a surface dislocation density of a top surface of the base layer is less than 1×10⁸ cm⁻².

It is also preferable that a surface dislocation density of an interface between the cladding layer and the active layer is less than 1×10⁸ cm⁻².

It is also preferable that a photo-luminescence peak wavelength distribution is not more than 40 meV. It is further preferable that the photo-luminescence peak wavelength distribution is not more than 20 meV It is also preferable that the at least photo-luminescent layer comprises $In_xAl_yGa_{1-x-y}N$ (0<x≦0.3, 0≦y≦0.05).

It is also preferable that the cladding layer has a gallium nitride based material having a lower refractive index than the active layer.

It is also preferable that the base layer extends over a substrate. It is further preferable that the base layer comprises one selected from the group consisting of GaN and AlGaN, and the cladding layer comprises AlGaN having an aluminum index of not less than 0.05. It is further more preferable that a thickness of the base layer is not less than 1 micrometer.

It is also preferable that the base layer comprises a substrate of a gallium nitride based material.

The second present invention provides a semiconductor device comprising: a base layer made of a gallium nitride-based material; a cladding layer extending over the base layer; and an active layer extending over the cladding layer, and the active layer including at least a photo-luminescent layer of $In_xAl_yGa_{1-x-y}N$ (0<x<1, 0≦y≦0.2), wherein a standard deviation σ of a microscopic fluctuation in a band gap energy of the photo-luminescent layer is not more than 40 meV.

It is preferable that the standard deviation σ of the microscopic fluctuation in the band gap energy of the photo-luminescent layer is not more than 30 meV It is also preferable that a standard deviation Δx of a microscopic fluctuation in an indium composition of the photo-luminescent layer is not more than 0.067. It is further preferable that the standard deviation Δx of the microscopic fluctuation in the indium composition of the photo-luminescent layer is not more than 0.04.

It is also preferable that a differential gain "dg/dn" of the active layer satisfies dg/dn≧1.0×10$^{-20}$ (m$^2$). It is further preferable that the differential gain "dg/dn" of the active layer satisfies dg/dn≧1.4×10$^{-20}$ (m$^2$).

It is also preferable that a surface dislocation density of a top surface of the base layer is less than 1×10$^8$ cm$^{-2}$.

It is also preferable that a surface dislocation density of an interface between the cladding layer and the active layer is less than 1×10$^8$ cm$^{-2}$.

It is also preferable that a photo-luminescence peak wavelength distribution is not more than 40 meV. It is further preferable that the photo-luminescence peak wavelength distribution is not more than 20 meV It is also preferable that the at least photo-luminescent layer comprises $In_xAl_yGa_{1-x-y}N$ (0<x≦0.3, 0≦y≦0.05).

It is also preferable that the cladding layer has a gallium nitride based material having a lower refractive index than the active layer.

It is also preferable that the base layer extends over a substrate. It is further preferable that the base layer comprises one selected from the group consisting of GaN and AlGaN, and the cladding layer comprises AlGaN having an aluminum index of not less than 0.05. It is further more preferable that a thickness of the base layer is not less than 1 micrometer It is also preferable that the base layer comprises a substrate of a gallium nitride based material.

The third present invention provides a semiconductor device comprising: a base layer made of a gallium nitride-based material; a cladding layer extending over the base layer; and an active layer extending over the cladding layer, and the active layer including at least a photo-luminescent layer of $In_xAl_yGa_{1-x-y}N$ (0<x<1, 0≦y≦0.2), wherein a differential gain "dg/dn" of the active layer satisfies dg/dn≧1.0×10$^{-20}$(m$^2$).

It is preferable that the differential gain "dg/dn" of the active layer satisfies dg/dn≧1.4×10$^{-20}$ (m$^2$).

It is also preferable that a standard deviation σ of a microscopic fluctuation in a band gap energy of the photo-luminescent layer is not more than 40 meV. It is further preferable that the standard deviation σ of the microscopic fluctuation in the band gap energy of the photo-luminescent layer is not more than 30 meV.

It is also preferable that a standard deviation Δx of a microscopic fluctuation in an indium composition of the photo-luminescent layer is not more than 0.067. It is further preferable that the standard deviation Δx of the microscopic fluctuation in the indium composition of the photo-luminescent layer is not more than 0.04.

It is also preferable that a surface dislocation density of a top surface of the base layer is less than 1×10$^8$ cm$^{-2}$.

It is also preferable that a surface dislocation density of an interface between the cladding layer and the active layer is less than 1×10$^8$ cm$^{-2}$.

It is also preferable that a photo-luminescence peak wavelength distribution is not more than 40 meV. It is further preferable that the photo-luminescence peak wavelength distribution is not more than 20 meV.

It is also preferable that the at least photo-luminescent layer comprises $In_xAl_yGa_{1-x-y}N$ (0<x≦0.3, 0≦y≦0.05).

It is also preferable that the cladding layer has a gallium nitride based material having a lower refractive index than the active layer.

It is also preferable that the base layer extends over a substrate. It is further preferable that the base layer comprises one selected from the group consisting of GaN and AlGaN, and the cladding layer comprises AlGaN having an aluminum index of not less than 0.05. It is further more preferable that a thickness of the base layer is not less than 1 micrometer.

It is also preferable that the base layer comprises a substrate of a gallium nitride based material.

The fourth present invention provides a layered structure comprising: an active layer including at least a first layer of $In_xAl_yGa_{1-x-y}N$ (0<x<1, 0≦y≦0.2), wherein a standard deviation Δx of a microscopic fluctuation in an indium composition of the photo-luminescent layer is not more than 0.067.

It is also preferable that the standard deviation Δx of the microscopic fluctuation in the indium composition of the photo-luminescent layer is not more than 0.04.

It is also preferable that a standard deviation σ of a microscopic fluctuation in a band gap energy of the photo-luminescent layer is not more than 40 meV. It is further preferable that the standard deviation σ of the microscopic fluctuation in the band gap energy of the photo-luminescent layer is not more than 30 meV.

It is also preferable that a surface dislocation density of a bottom surface of the first layer is less than 1×10$^8$ cm$^{-2}$.

It is also preferable that a photo-luminescence peak wavelength distribution is not more than 40 meV. It is further preferable that the photo-luminescence peak wavelength distribution is not more than 20 meV.

It is also preferable that the at least photo-luminescent layer comprises $In_xAl_yGa_{1-x-y}N$ (0<x≦0.3, 0≦y≦0.05).

The fifth present invention provides a layered structure comprising: an active layer including at least a first layer of $In_xAl_yGa_{1-x-y}N$ (0<x<1, 0≦y≦0.2), wherein a standard deviation σ of a microscopic fluctuation in a band gap energy of the photo-luminescent layer is not more than 40 meV.

It is preferable that the standard deviation σ of the microscopic fluctuation in the band gap energy of the photo-luminescent layer is not more than 30 meV.

It is also preferable that a standard deviation Δx of a microscopic fluctuation in an indium composition of the photo-luminescent layer is not more than 0.067. It is further preferable that the standard deviation Δx of the microscopic fluctuation in the indium composition of the photo-luminescent layer is not more than 0.04.

It is also preferable that a surface dislocation density of a bottom surface of the first layer is less than 1×10$^8$ cm$^{-2}$.

It is also preferable that a photo-luminescence peak wavelength distribution is not more than 40 meV. It is further preferable that the photo-luminescence peak wavelength distribution is not more than 20 meV.

It is also preferable that the at least photo-luminescent layer comprises $In_xAl_yGa_{1-x-y}N$ ($0<x\leq0.3$, $0\leq y\leq0.05$).

The sixth present invention provides a method of forming a semiconductor device, comprising the steps of: forming a cladding layer over a base layer made of a gallium nitride-based material; and forming an active layer over the cladding layer by a metal organic vapor phase epitaxy method using a source gas which contains an ammonium gas, and the active layer including at least a photo-luminescent layer of $In_xAl_yGa_{1-x-y}N$ ($0<x<1$, $0\leq y\leq0.2$), wherein a partial pressure of the ammonium gas is maintained to be not more than 110 hPa at least when the photo-luminescent layer is formed.

It is preferable that the partial pressure of the ammonium gas is maintained to be not more than 95 hPa at least when the photo-luminescent layer is formed.

It is also preferable that a surface dislocation density of a top surface of the base layer is less than $1\times10^8$ cm$^{-2}$.

It is also preferable that a surface dislocation density of an interface between the cladding layer and the active layer is less than $1\times10^8$ cm$^{-2}$.

It is also preferable that the at least photo-luminescent layer comprises $In_xAl_yGa_{1-x-y}N$ ($0<x\leq0.3$, $0\leq y\leq0.05$).

It is also preferable that the cladding layer has a gallium nitride based material having a lower refractive index than the active layer.

It is also preferable that the base layer is formed over a substrate. It is further preferable that the base layer comprises one selected from the group consisting of GaN and AlGaN, and the cladding layer comprises AlGaN having an aluminum index of not less than 0.05. It is further more preferable that a thickness of the base layer is not less than 1 micrometer.

It is also preferable that the cladding layer is formed over the base layer which comprises a substrate of a gallium nitride based material.

In accordance with the present invention, the "micro-fluctuation" in the sub-micron or smaller order scale is important. As described above, the word "fluctuation in indium composition" means a position-dependent fluctuation possessed by a spatial distribution in indium composition, which corresponds to a position-dependent variation in indium composition. The word "fluctuation in band gap energy" means a position-dependent fluctuation possessed by a spatial distribution in band gap energy, which corresponds to a position-dependent variation in band gap energy. The word "microscopic fluctuation" means a position-dependent fluctuation in a microscopic space which is defined by the sub-micron or smaller order scale which is less than 1 micrometer scale. The word "macroscopic fluctuation" means a position-dependent fluctuation in a macroscopic space which is defined by 1 micron or larger order scale. The "macroscopic fluctuation" is measurable by a micro-photo-luminescence measurement method with a beam spot diameter of not less than 1 micrometer. The "microscopic fluctuation" is hard to be measured by the micro-photo-luminescence measurement method with the beam spot diameter of not less than 1 micrometer.

In accordance with the conventional common sense, since the conventional gallium nitride laser diode has the InGaN active layer which include many dislocations, it is considered that an indium-compositional fluctuation is desirable for obtaining good laser performances.

Contrary to the conventional common sense, in accordance with the present invention, it is important that the surface dislocation density of the base layer or the surface dislocation density of the bottom surface of the active layer is reduced as many as possible and further that both the micro-fluctuations in the indium composition and the band gap energy of the photo-luminescent layer in the active layer are controlled within predetermined individual levels as defined above so as to keep both the high photo-luminescent efficiency and the desirable laser threshold value and further to realize the possible long life-time of the laser device.

There are two main reasons for deteriorating the semiconductor laser device. One is the deterioration of the facet. Another is the increase in the defects of the active layer. The facet deterioration is also so called to as impact deterioration, wherein the current laser emission is instantaneously discontinued. The increase in the defects of the active layer is gentle and not instantaneous, for which reason the operating current is gradually decreased. It was already confirmed that the conventional laser diode shown in FIG. 1 shows a gradual decrease in the operating current due to the gradual increase the defects of the active layer. In order to realize the long life-time of the device, it is effective to prevent the increase the defects of the active layer.

The fluctuations in the compositions and in the band gap energy of the active layer might generate local strains in the active layer. Those local strains cause defects in the active layer upon receipt of energy from heat, photons and carriers in the device operation at a high temperature. The present inventors considered that in order to realize the life-time of the device, it is effective to reduce the fluctuations in the compositional profile and band gap energy profile of the active layer.

Each of the fluctuations in the compositional profile and the band gap energy profile of the active layer are classified into two types, first one is the "macroscopic fluctuation" in the macroscopic scale, and second one is the "microscopic fluctuation" in the microscopic scale. The "macroscopic fluctuation" means the fluctuation in the scale which is measurable by the micro-photo-luminescence measurement with a beam spot diameter of not less than 1 micrometer, wherein the "microscopic fluctuation" is represented by a measured photo-luminescence peak wavelength distribution. The photo-luminescence peak wavelength distribution is ranged from a maximum value to a minimum value of the measured photo-luminescence peak wavelength. In the prior art common sense, the fluctuation generally means the "macroscopic fluctuation" which is measurable by the photo-luminescence measurement, namely the fluctuation in the 1-micrometer order scale because the micro-photo-luminescence measurement is made with the beam spot diameter of not less than 1 micrometer. In Japanese laid-open patent publication No. 11-340580, the described fluctuation is the "macroscopic fluctuation" in the macroscopic scale, and this prior art was to reduce the "macroscopic fluctuation" for preventing laser emission in multiple wavelength.

The present invention focus on the fluctuation in the shorter or smaller scale than "macroscopic fluctuation" in the above conventional common sense. The present invention focus on the "microscopic fluctuation" in the microscopic scale which is shorter than the carrier diffusion length, for example, approximately 1 micrometers in accordance with the present invention, the "microscopic fluctuation" is of the sub-micron order scale, typically 500 nanometers or less. The present invention intends to control the "microscopic fluctuation" for controlling the local strains in the active layer including the photo-luminescent layer in order to realize the long life-time of the semiconductor laser diode.

In Japanese laid-open patent publication No. 11-340580, it is mentioned to reduce the fluctuation in the macroscopic scale for controlling the laser emission in multiple wavelengths. The reduction in the fluctuation in the macroscopic scale does not realize the long life-time of the device in the operation at high temperature for the reasons which will be described below in the embodiments.

The present invention is to reduce the "microscopic fluctuations" in the compositional profile and the band gap energy profile of the active layer in the microscopic scale which is immeasurable by the micro-photo-luminescence measurement, whereby the long life-time of the device in the operation at high temperature is realized.

In the past, there had been no investigation on control of the "microscopic fluctuations" in the microscopic scale nor report about any influence of the "microscopic fluctuations" to the device performances. There had not been known any certain or available method of how to reduce the "microscopic fluctuations" in the microscopic scale. As disclosed in Japanese laid-open patent publication No. 11-340580, it had been known that the "macroscopic fluctuations" in the macroscopic scale is reducible by reducing the dislocation density of the substrate and adjusting the growth rate of the active layer. The reductions of the "microscopic fluctuations" are not obtained by those conventional methods.

The present invention was established by drawing the attention to the "microscopic fluctuations" which had never been considered in the prior art. The present invention was realized by the reductions in the "microscopic fluctuations" in the compositional profile and the band gap energy profile of the active layer in the microscopic scale, and also by keeping a desirable high differential gain if the semiconductor device is applied to the laser diode. Those reductions in the "microscopic fluctuations" provide the effects that the local strain in the photo-luminescent layer included in the active layer is reduced and that the deterioration in the active layer under the high temperature operation condition is prevented. The words "photo-luminescence layer" and "photo-luminescent layer" mean the layer which is included in the active layer and which allows an inverted population, thereby to generate a certain gain. If the active layer comprises a quantum well structure, one or more quantum well layers correspond to the photo-luminescent layers. If the active layer is free of the quantum well structure, then the active layer might generally correspond to the photo-luminescent layer.

The present invention provides the semiconductor device having a multi-layer structure of a base layer, a cladding layer extending over the base layer and the active layer extending over the cladding layer. The base layer is made of a gallium nitride based material. A top surface of the base layer has a surface dislocation density of less than $1 \times 10^8$ $cm^{-2}$. Since the surface dislocation density of the base layer is low, the dislocation density of the active layer is also low. The selection of the gallium nitride based material for the base layer allows a reduction in residual strain of the cladding layer. This reduction in residual strain of the cladding layer results in a reduction in residual strain of the active layer. For the present invention, it is preferable that the active layer has a reduced dislocation density and a reduced residual strain.

In accordance with the present invention, the active layer has the reduced dislocation density. The generation is effectively prevented of the defects in the active layer in the device operation at a high temperature. The prevention of the formation of the defects in the active layer prevents that carriers are trapped in the defects to cause non-luminescent recombination. This realizes the long life-time and high efficiency of the device. For example, the long life-time of not less than 5000 hours can be realized under the operational conditions of a temperature of 70° C., and an output power of 30 mW without any drop of the efficiency of the devices The present invention is to reverse the conventional technical common sense. In accordance with the conventional technical common sense, if not only the "macroscopic fluctuation" but also the "microscopic fluctuation" are reduced in each of the compositional profile and the b and gap energy profile of the photo-luminescent layer, then it is concerned that the threshold current density is increased for the following reasons. In accordance with the conventional technical common sense, the reductions in not only the "macroscopic fluctuation" but also the "microscopic fluctuation" in each of the compositional profile and the band gap energy profile of the photo-luminescent layer would make it difficult to cause the inverted population in the photo-luminescent layer. Even if the dislocation density of the active layer is reduced, then the reduced dislocations in the photo-luminescent layer causes the non-luminescent recombination. Therefore, the conventional technical common sense concerns the increase the density of the threshold current.

The present inventors confirmed the facts that the reductions in not only the "macroscopic fluctuation" but also the "microscopic fluctuation" in each of the compositional profile and the band gap energy profile of the photo-luminescent layer do not cause any substantive increase in the threshold current density, contrary to the above conventional technical common sense concern. The reduction in the "microscopic fluctuation" in each of the compositional profile and the band gap energy profile the photo-luminescent layer does increase the differential gain which contributes to suppress the increase of the threshold current density.

In accordance with the present invention, the base layer is made of the gallium nitride based material and has a low surface dislocation density of less than $1 \times 10^8$ $cm^{-2}$. The cladding layer is formed over the base layer The active layer including the photo-luminescent layer is formed over the cladding layer. The active layer is formed by a metal organic vapor phase epitaxy method using a source gas which contains an ammonium gas, wherein a partial pressure of the ammonium gas is maintained to be not more than a predetermined value, for example, 110 hPa at least when the photo-luminescent layer is formed. The low surface dislocation density of the gallium nitride based material base layer and the controlled partial pressure of the ammonium gas realize the reductions in the "microscopic fluctuations" in the indium composition and the band gap profile of the active layer, whereby the differential gain is increased. This allows the device to have the desirable long life-time and the high efficiency. The base layer may comprise a substrate of the gallium nitride based material, for example, GaN and AlGaN. The base layer may, of course, comprise the gallium nitride based material layer over any substrate, for example, semiconductor or semi-insulating substrate. The semi-insulating substrate may comprise a sapphire substrate. The sapphire substrate makes it easy to do a desirable highly accurate control to the "microscopic fluctuations" in the indium composition and the band gap profile of the active layer. If the substrate comprises a SiC substrate, then a tensile strain is generated in the overlying semiconductor layer due to relationship in thermal expansion coefficient. This tensile strain makes it difficult to do the desirable highly accurate control to the "microscopic fluctuations" in the indium composition profile and the band gap profile of the active layer. The surface dislocation density of the base layer or of the active layer is preferably less than $1 \times 10^8$ cm$^{-2}$ for the purpose of certain reductions in the "microscopic fluctuations" in the indium composition and the band gap profile of the active layer.

As described above, in order to reduce both the "macroscopic fluctuation" and the "microscopic fluctuation" in the indium composition profile and the band gap profile of the active layer, it is effective to control the partial pressure of the ammonium gas, for example, not more than 110 hPa in the metal organic vapor phase epitaxy for forming at least the photo-luminescent layer for the purpose of adjusting the growth rate. The control to the partial pressure of the ammonium gas results in a high differential gain of not less than $1 \times 10^{-20}$ m$^2$ The high differential gain allows the required reduction in the "microscopic fluctuation" in the indium composition of the active layer, and also allows that the photo-luminescent wavelength distribution is limited to be not more than 20 meV. The photo-luminescent wavelength distribution corresponds to the "macroscopic fluctuation" in the band gap energy profile.

In accordance with the present invention, in order to reduce the internal loss, it is effective that a self confinement hetero-structure layer in a p-type electrode side comprises a non-doped layer, and that a growth temperature is kept high, for example, not less than 1100° C. In general, the self confinement hetero-structure layer in the p-type electrode side is doped with magnesium, resulting in crystal imperfection and formation of impurity level. These crystal imperfection and impurity level formation makes it difficult to reduce the internal loss. In accordance with the present invention, in order to reduce the internal loss, the self confinement hetero-structure layer in the p-type electrode side is not doped and further the growth conditions are properly selected.

In accordance with the present invention, the photo-luminescence peak wavelength distribution is preferably not more than 40 meV and more preferably not more than 20 meV for the purpose of effectively reducing the threshold current. If the photo-luminescence peak wavelength distribution is ranged to be much higher value than 40 meV, then the threshold current is also high and the power consumption is also high.

The base layer means a layer over which layers constituting the laser diode are provided. As described above, the base layer may comprise a crystal growth substrate of the gallium nitride based material such as GaN and AlGaN. Alternatively, the base layer may comprise a base layer provided over any substrate, for example, the semiconductor or semi-insulating substrate. For example, the semi-insulating substrate may comprise a sapphire substrate. The word "surface dislocation density" means a density of through dislocation on the surface of the layer. The base layer having the surface dislocation density of less than $1 \times 10^8$ cm$^{-2}$ may, for example, be obtained by either a facet-initiated epitaxial lateral over growth method or a pendio-epitaxy method.

The formation of the base layer in the facet-initiated epitaxial lateral over growth method may be made as follows. A thin GaN layer is formed over a sapphire substrate. Stripe-shaped Si$_{O2}$ masks are formed on the thin GaN layer. A selective lateral growth of the GaN layer from an opening portion of the stripe-shaped Si$_{O2}$ masks is carried out, so that the GaN layer has a reduced surface dislocation density, wherein extensions of dislocations are blocked by the Si$_{O2}$ masks and also changed in direction toward a lateral direction parallel to the surface of the substrate in the selective lateral growth. This facet-initiated epitaxial lateral over growth method is disclosed in 1999 Applied Physics vol. 68, 7, pp. 774–779.

The formation of the base layer in the pendio-epitaxy method may be made as follows. A low temperature buffer layer is formed over a substrate. A single crystal GaN layer is formed over the buffer layer. Etching masks are provided on the single crystal GaN layer. A selective etching to the single crystal GaN layer is carried out by use of the etching masks to form a stripe-shaped single crystal GaN pattern. A crystal growth from either a top surface or a side face of the stripe-shaped single crystal GaN pattern is made, thereby forming a base layer having a reduced surface dislocation density. This pendio-epitaxy method was reported by Tsvetankas. Zheleva et al. in MRS Internet J. Nitride Semiconductor Res. 4S1, G3 38 (1999).

The following method is also available to obtain the substrate having a further reduced dislocation density. A buffer layer is formed on the sapphire substrate. A gallium nitride based single crystal layer is formed on the buffer layer. The gallium nitride based single crystal layer is selectively etched to form gallium nitride based single crystal islands over the buffer layer. The gallium nitride based single crystal islands are used as seeds for crystal growth to form the base layer having the reduced surface dislocation density. In place of the selective etching process, growth conditions for the gallium nitride based single crystal layer may be selected to grow gallium nitride based single crystal islands over the buffer layer.

In accordance with the present invention, the surface dislocation density of the base layer is preferably less than $1 \times 10^8$ cm$^{-2}$, and more preferably $1 \times 10^7$ cm$^{-2}$. If the dislocation density of the base layer is much higher than $1 \times 10^8$ cm$^{-2}$, then it is difficult to realize the long life-time of the device even the "microscopic fluctuations" in the indium composition profile and the band gap energy profile are reduced and the differential gain is increased. If the dislocation density of the base layer is suppressed less than $1 \times 10^8$ cm$^{-2}$, particularly less than $1 \times 10^7$ cm$^{-2}$, a multiplier effect of the low dislocation density and the reduced "microscopic fluctuations" is obtained. This allows improvement in the life-time of the device with keeping the good device performances. The surface dislocation density is measurable by the known methods, for example, by measuring etch-pits of the layer or observation to a sectioned area of the layer by a transmission electron microscope. The base layer having the reduced dislocation density is obtainable by using the single crystal islands as seeds for the crystal growth.

The base layer may comprise a low dislocation single crystal GaN layer grown over the substrate by the facet-initiated epitaxial lateral over growth. The base layer may also comprise a low dislocation single crystal AlGaN layer grown over the substrate by the facet-initiated epitaxial lateral over growth. The base layer may also comprise a low dislocation single crystal GaN layer grown over the substrate by the pendio-epitaxy method. The base layer may also comprise a low dislocation single crystal AlGaN layer grown over the substrate by the pendio-epitaxy method. The base layer may also comprise a low dislocation single crystal GaN layer grown by the crystal growth from the single crystal gallium nitride islands over the substrate. The base layer may also comprise a low dislocation single crystal GaN layer grown by the crystal growth from the single crystal aluminum gallium nitride islands over the substrate. The substrate may optionally be removed after the low dislocation single crystal GaN or AlGaN layer has been grown on the substrate. Since the base layer is of the low surface dislocation density, the base layer is not inclusive of a low temperature buffer layer deposited at a low temperature, for example, about 500° C.

As described above, the base layer comprises one of the gallium nitride based materials such as AlGaN and GaN. The word "gallium nitride based material" means that any materials which include at least both nitrogen and gallium. The selection of any one of AlGaN and GaN for the base layer is preferable for improving both an optical confinement rate and the device life-time. In case of a gallium nitride based semiconductor laser diode, the cladding layer may be made of AlGaN, wherein it is preferable for obtaining a desired high optical confinement rate that a compositional ratio of aluminum in the cladding layer is high and also that a thickness of the cladding layer is thick. If the semiconductor laser diode is applied to emit a laser beam having a luminescent wavelength in the range of 390–430 nanometers for the purpose of optical disk, it is preferable that the thickness of the cladding layer is 1 micrometer or more and the aluminum compositional ratio is not less than 0.05 and more preferably not less than 0.07. In this case, selection of GaN or AlGaN for the base layer is preferable, so as to make both thermal expansion coefficient and lattice constant similar between the base layer and the cladding layer, whereby a residual strain of the cladding layer is reduced as compared to when the base layer is different in material from the cladding layer. The reduction in residual strain of the cladding layer is effective for preventing the deterioration of the active layer in the high temperature operation. The above selection of the material for the base layer also increases the available range of the thickness and the aluminum composition rate of the cladding layer, and also makes it easy to obtain a high optical confinement rate If the base layer is made of GaN or AlGaN, then the thickness of the base layer is preferably thick, for example, not less than 1 micrometer and more preferably not less than 5 micrometers for effectively reducing the residual strain.

Figure 3:
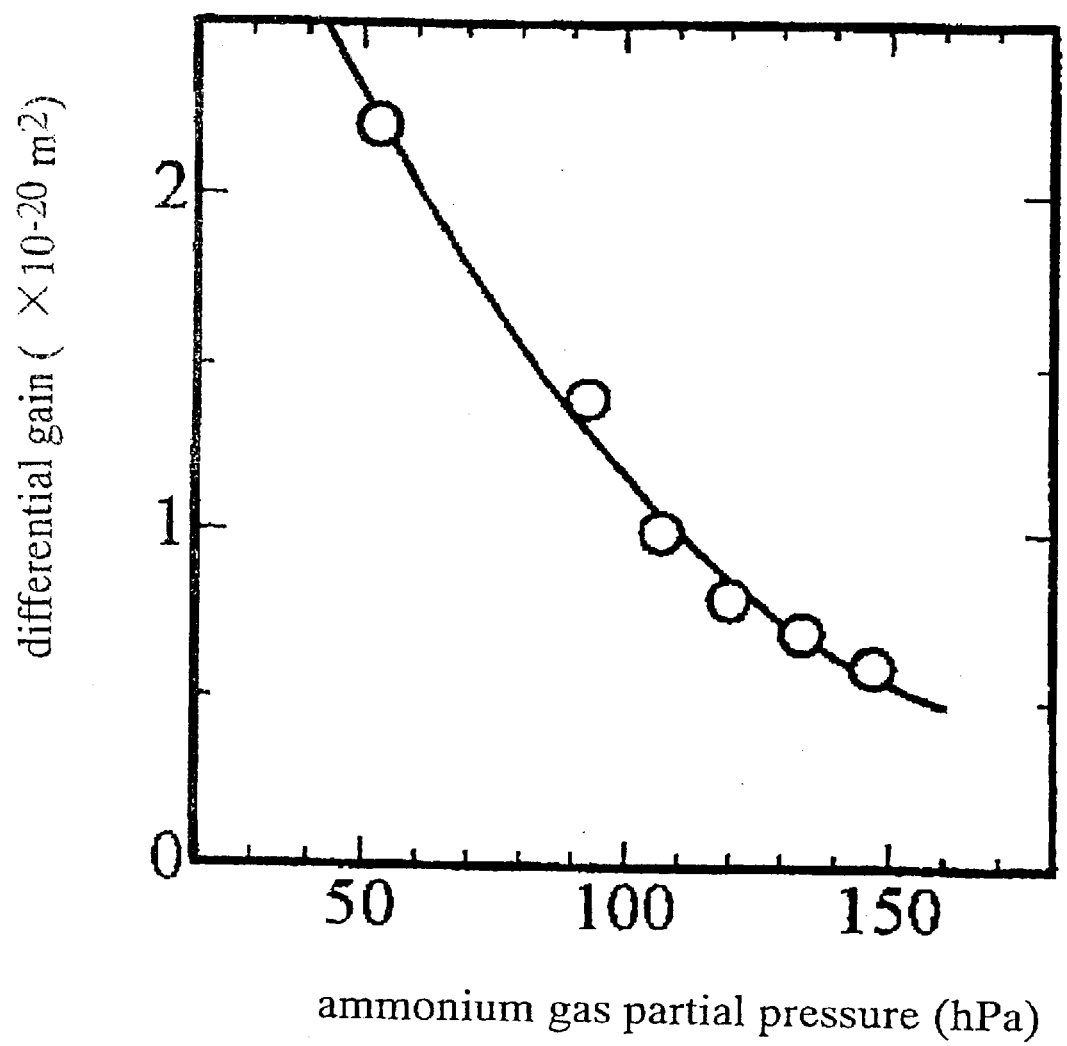
FIG. 3 is a diagram illustrative of a variation in differential gain over an ammonium gas partial pressure in a metal organic vapor phase epitaxy for forming an InGaN quantum well active layer as a photo-luminescent layer.

In order to realize the reductions in the "microscopic fluctuations" in the indium composition profile and the band gap energy profile of the photo-luminescent layer and also to obtain the desired high differential gain, it is preferable to consider the growth conditions of the photo-luminescent layer. FIG. 3 is a diagram illustrative of a variation in differential gain over an ammonium gas partial pressure in a metal organic vapor phase epitaxy for forming an InGaN quantum well active layer as a photo-luminescent layer. As the ammonium gas partial pressure is decreased, then the obtainable differential gain is increased. In order to obtain the desirable high differential gain and also reduce the above "micro-fluctuations" in the indium composition profile and the band gap energy profile, it is preferable that the ammonium gas partial pressure is not less than the predetermined level, for example, 110 hPa and more preferably 95 hPa.

In accordance with the present invention, the standard deviation $\Delta x$ of the microscopic fluctuation in the indium composition of the photo-luminescent layer is preferably not more than 0.067, and more preferably not more than 0.04 for realizing the long life-time of the device in the high temperature and high output operation.

In accordance with the present invention, the standard deviation $\sigma$ of the microscopic fluctuation in the band gap energy of the photo-luminescent layer is not more than 40 meV, and more preferably not more than 30 meV for realizing the long life-time of the device in the high temperature operation.

In accordance with the present invention, the differential gain "dg/dn" of the active layer is not less than $1.0\times10^{-20}$ ($m^2$), and more preferably not more than $1.4\times10^{-20}$ ($m^2$) for realizing the long life-time of the device in the high temperature operation.

For the present invention, it is important to reduce the "micro-fluctuations" in the indium composition profile and the band gap energy profile of the photo-luminescent layer. The micro-photo-luminescent measurement is applicable to only the measurement to the "macroscopic fluctuations" but inapplicable to the measurement to the "microscopic fluctuations". In accordance with the present invention, the "microscopic fluctuation" is measured from the dependency on the photo-luminescence life-time.

Figure 4:
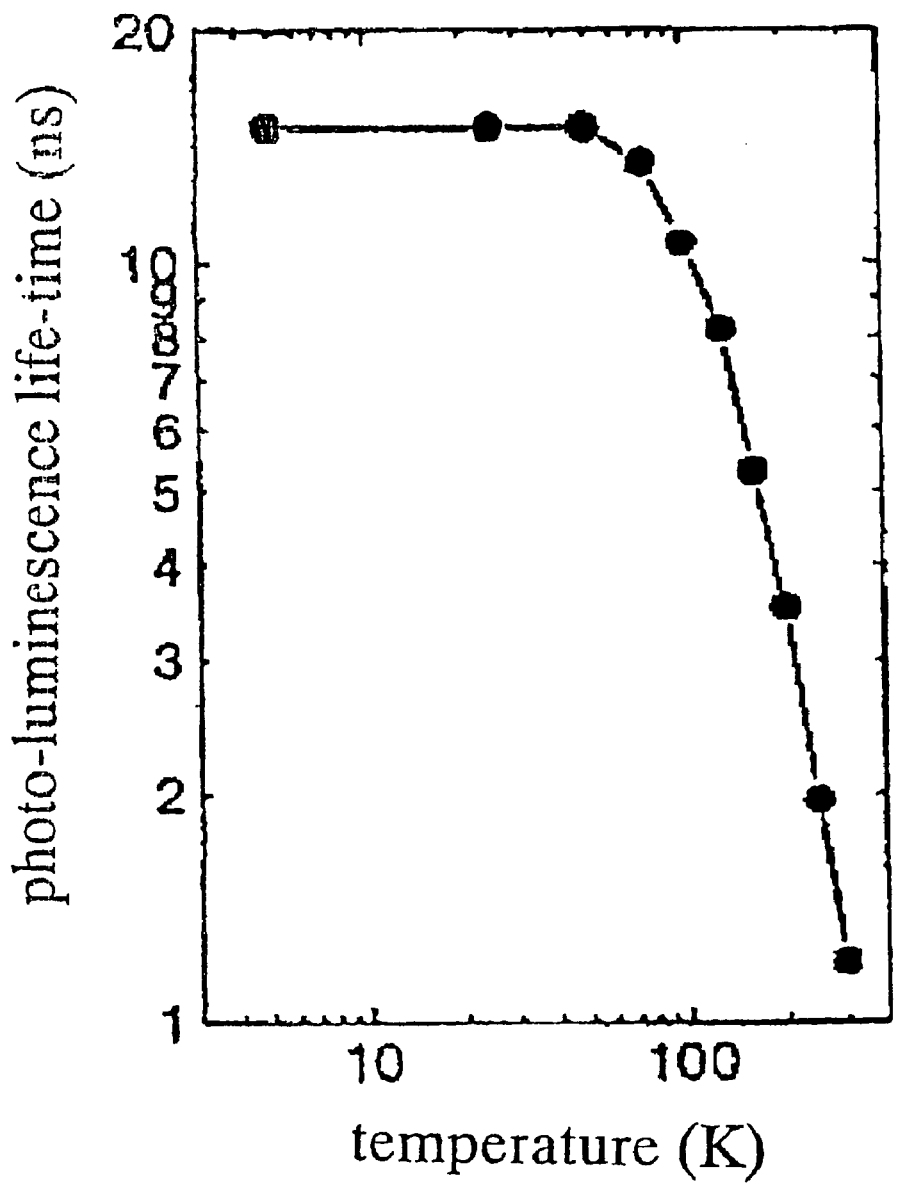
FIG. 4 is a diagram illustrative of variation in measured photo-luminescent life-time over temperature of the semiconductor laser diode of FIG. 1.

The following measurement method was carried out to measure the "microscopic fluctuation" in the band gap energy profile due to the "microscopic fluctuation" in the indium composition of the InGaN quantum well layer as the photo-luminescent layer provided in the InGaN quantum well laser diode shown in FIG. 1. FIG. 4 is a diagram illustrative of variation in measured photo-luminescent life-time over temperature of the semiconductor laser diode of FIG. 1. The photo-luminescent life-time was measured as follows. A light is irradiated onto a surface of the semiconductor laser diode to cause an excitation of the laser, wherein the light comprises a secondary higher harmonic wave of a pico-second titanium sapphire laser, where the secondary higher harmonic wave has a wavelength of 370 nanometers, and an output of 5 mW and a cyclic frequency of 80 MHz. An emitted light from the semiconductor laser diode is transmitted through lenses to a spectroscope, wherein a spectral light is then detected by a photo-multiplier, and a time resolution measurement is made by a single photon counting method. The time resolution measurement may also be made by use of a streak camera. The temperature varies in the range of 5K to 300K by a temperature-variable cryostat using a liquid helium.

The variation of the photo-luminescence over temperature has an inter-relationship with the "microscopic fluctuation" of the band gap energy. Electrons excited by photons are captured by valley portions of the "microscopic fluctuation" of the potential energy or the band gap energy, wherein the "microscopic fluctuation" of the potential energy or the band gap energy is provided by the "microscopic fluctuation" of the indium composition profile. The captured electrons in the valley portions are heard to freely move from the valley portions over the potential barriers. This means that the probability of capturing the electrons into the defects or non-radiation centers is low, whereby the photo-luminescence life-time is long. If the temperature is increased, the captured electrons in the valley portions receive heat energy and thermally excited, and the thermally excited electors may be movable over the potential barriers of the "microscopic fluctuation" of the potential energy or the band gap energy. This means that the probability of capturing the electrons into the defects or non-radiation centers is high, whereby the photo-luminescence life-time is short. FIG. 1 shows that if the temperature is increased from 100K, then the photo-luminescence life-time is made short rapidly. The curve of FIG. 1 is fitted with and represented by the following equation.

$$\tau_{PL}^{-1} = \tau_0^{-1} + AT^{1/2} \exp(-T_0/T) \quad (1)$$

where $\tau_{PL}$ is the photo-luminescence life-time, T is the temperature, $\tau_0$, A, and $T_0$ are fitting parameters. If the temperature is low, then the electrons remain captured in the valley portions of the potential having the "microscopic fluctuations", for which reason recombination appears depending on the intrinsic life-time $\tau_0$. At a low temperature, the second term of the above equation is ineffective and only the first term is effective. This means that the life-time is constant at $\tau_0$. As the temperature is increased, the thermal excitation of electrons is caused. Assuming that the potential barrier provided by the "microscopic fluctuation" is $kT_0$, where k is the Boltzmann's constant, a rate of the excited carriers is proportional to $\exp(-T_0/T)$. The thermally excited carriers are movable over the potential barriers from the potential valleys provided by the "microscopic fluctuations" are then captured. T is possible that the thermally excited carriers are captured in the defects or the non-radiation center. He probability of capturing the electrons is given by Nvs, where "N" is the density of the defects, "v" is the thermal velocity and "s" is the capture cross section. If the attention is drawn only onto the temperature dependency, then the thermal velocity is proportional to a square root of the temperature. Namely, $Nvs=AT^{1/2}$ is established. If the temperature is increased, the non-radiation recombination frequently appears based on the above mechanism. The recombination velocity of the carriers is given by $AT^{1/2}\exp(-T_0/T)$. Namely, the recombination velocity of the carriers is given by the second term of the above equation. The parameter T0 is obtainable by the above fitting process. This parameter T0 is an index parameter for the degree of the "microscopic fluctuation" of the indium component profile. For example, T0 is 460K which is obtained from the pitting process based on FIG. 4.

The following descriptions will focus on the relationship between the parameter T0 and the "microscopic fluctuation" of the band gap energy profile. "kT0" corresponds to a thermal energy necessary for allowing electrons to freely move over the potential barriers provided by the "microscopic fluctuation" of the band gap energy profile. The "kT0" is proportional to the "microscopic fluctuation" of the potential of the electrons distributed in the specific space. If the "microscopic fluctuation" is processed by the potential of the electrons distributed in the two-dimensional space such as the quantum well, electrons having energies which are lower than a spatial-averaged potential value are localized and are not free to move over the potential barriers, whilst electrons having energies which are lower than the spatial-averaged potential value are free to move over the potential barriers. Those are deduced from the classical percolation theory. Thus, the "kT0" may be considered to be a difference in energy level from the bottom of the valley portions to the averaged potential level. Assuming that the spatial distribution of the potential energy is the normal distribution with a standard deviation $\sigma_e$, then the valley of the potential is lower in energy level by about $2\sigma_e$ than the averaged potential value, whereby $\sigma_e=0.5kT0$ is derived. The standard deviation $\sigma_g$ of the "microscopic fluctuation" of the band gap energy of InGaN corresponds to a sum of the "microscopic fluctuation" in potential of the conduction band and the "microscopic fluctuation" in potential of the valence band. In Applied Physics Letters vol. 68, p. 2541, 1996, Martin et al. address that if a band off-set ratio of the conduction band and the valence band of the InGaN based compound semiconductor is 3:7, then $\sigma_g=3.33\sigma_e=1.67$ kT0. The standard deviation $\sigma g$ of the "microscopic fluctuation" of the band gap energy of InGaN is found from T0 by use of the above equation. In case of FIG. 4, the standard deviation $\sigma_g$ of the "microscopic fluctuation" of the band gap energy is found to be a large value, for example, 66 meV.

The micro-photo-luminescent measurement with a micro-beam spot of a diameter of 1 micrometers to the semiconductor laser diode shown in FIG. 1 was carried out. The distribution of the photo-luminescent peak wavelength is within the range of −1 nanometer to +1 nanometer, which corresponds to a range of −9 meV to +9 meV. The fluctuation the indium composition profile in the scale over 1 micrometer could not be measured. Notwithstanding, the fluctuation the indium composition profile was measured by a different measurement method based on a temperature-dependency of the photo-luminescence life-time. This means that the fluctuation the indium composition profile is the "microscopic fluctuation" of the sub-micron order scale which is not measurable by the photo-luminescence measurement.

In the above description, the "microscopic fluctuation" of the indium composition profile is represented by the standard deviation σ of the "microscopic fluctuation" of the band gap energy profile. The following descriptions will focus on a relationship between the standard deviation Δx of the "microscopic fluctuation" of the indium composition profile $In_xGa_{1-x}N$ and the standard deviation σ of the "microscopic fluctuation" of the band gap energy profile. In Journal of Applied Physics 1975, vol. 46, p. 3432, Osamura et al. describes as follows. The band gap energy of $In_xGa_{1-x}N$ is given by the following equation.

$$Eg(x)=3.40(1-x)+2.07x-1.0\times(1-x) (unit:eV)$$

If x=in the range of about 0.1 to about 0.3, then dEg/dx=0.6 (eV). The relationship between the standard deviation Δx of the "microscopic fluctuation" of the indium composition profile and the standard deviation $\sigma_g$ of the "microscopic fluctuation" of the band gap energy profile is given by the following equation.

$$\Delta x=\sigma_g/0.6(eV)$$

If the standard deviation of the "microscopic fluctuation" of the band gap energy profile is not more than 40 meV, then this means that the standard deviation of the "microscopic fluctuation" of the indium composition profile is not more than 0.067.

Figure 5:
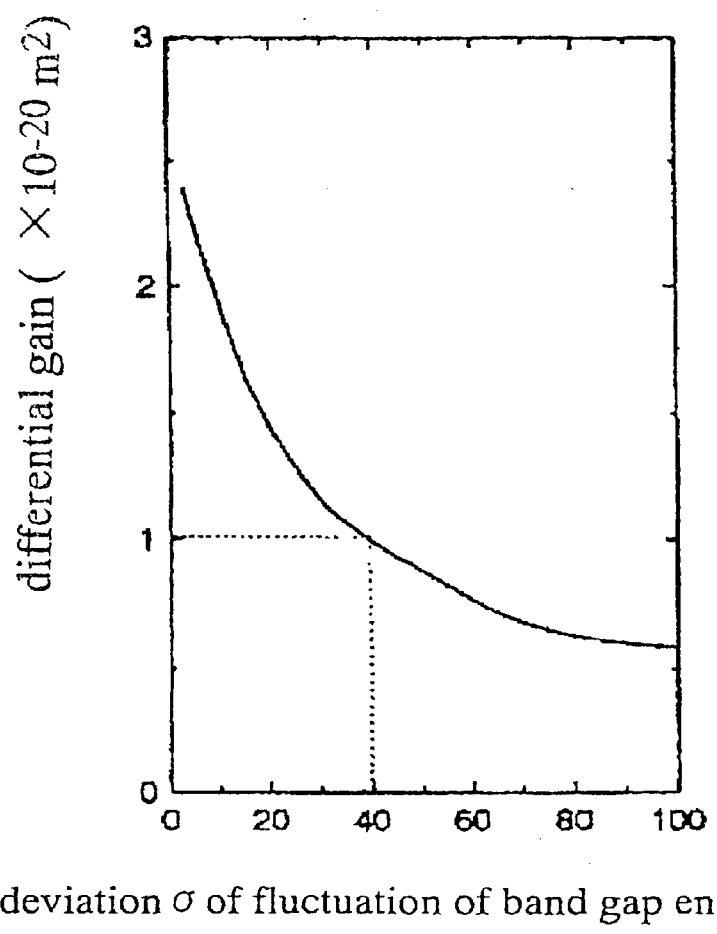
FIG. 5 is a diagram illustrative of a variation in differential gain over the standard deviation σg of the "microscopic fluctuation" of the band gap energy profile, wherein the differential gain is theoretically calculated.

Further, the description will focus on the relationship between the standard deviation σ of the "microscopic fluctuation" of the band gap energy profile of $In_xGa_{1-x}N$ and the differential gain of the laser diode. Each of the "microscopic fluctuation" of the band gap energy profile and the "microscopic fluctuation" of the indium composition profile has an inter-relationship with the differential gain. FIG. 5 is a diagram illustrative of a variation in differential gain over the standard deviation $\sigma_g$ of the "microscopic fluctuation" of the band gap energy profile, wherein the differential gain is theoretically calculated. As the standard deviation σ g of the "microscopic fluctuation" of the band gap energy profile is increased, then the differential gain is decreased. If the "microscopic fluctuation" of the band gap energy profile is large, then the density of state at the band edge is gently risen, whereby the gain saturation by the carrier injection is likely to be caused. As a result, a small differential gain is obtained. By contrast, if the "microscopic fluctuation" of the band gap energy profile is small then the density of state of the step function based on the two-dimensionality of the quantum well is effective, whereby a large differential gain is obtained. In FIG. 5, if the standard deviation $\sigma_g$ of the "microscopic fluctuation" of the band gap energy profile is 40 meV, then the differential gain is $1.0\times10^{-20}$ $m^2$. If the standard deviation $\sigma_g$ of the "microscopic fluctuation" of the band gap energy profile is not more than 40 meV, then this means that the differential gain is not less than $1.0\times10^{-20}m^2$.

The above descriptions are commonly applicable to the device the photo-luminescence layer of $In_xAl_yGa_{1-x-y}N$ ($0<x<1$, $0\leq y\leq 0.2$). Notwithstanding, it is particularly preferable that the photo-luminescence layer has a composition of $In_xAl_yGa_{1-x-y}N$ ($0<x\leq 0.3$, $0\leq y \leq 0.5$) or another composition of $In_xGa_{1-x}N$ ($0<x\leq 0.3$).

The descriptions will then focus on relationships of the present invention from the above decried first, second and third prior arts. The first prior art is disclosed in IEEE Journal Of Selected Topics In Quantum Electronics vol. 3, No. 3, June 1997. The second and third prior arts are discussed in Japanese laid-open patent publication No. 11-340580.

In accordance with the present invention, a gallium nitride based material or, sapphire is preferably selected for the substrate material for the purpose of define the compositional profile of the active layer and the fluctuation of the band gap energy of the active layer. It is of course possible that silicon carbide is selected for the substrate material. This selection makes not easy to adjust the "microscopic fluctuation" of the compositional profile of the active layer. Sapphire is larger in thermal expansion coefficient than the gallium nitride based materials. The gallium nitride based materials are larger in thermal expansion coefficient than silicon carbide. After the gallium nitride based semiconductor layer is formed over the silicon carbide substrate, then a cooling process is carried out, whereby tensile strains reside in the gallium nitride based semiconductor layer in a plane parallel to the surface of the substrate. If the silicon carbide substrate is used for the semiconductor laser diode, then the tensile thermal strain resides in the active layer. The residual tensile strain makes it difficult to stably adjust the compositional fluctuation particularly the compositional microscopic fluctuation.

If the sapphire substrate is used for the semiconductor laser diode, then only the compressive thermal strain resides in the gallium nitride based semiconductor layer in a plane parallel to the surface of the substrate. The semiconductor layer has a higher strength against the compressive strain than the tensile strain. Thus, it is relatively easy to stably adjust the compositional fluctuation. If GaN or AlGaN is selected for the substrate material, then the gallium nitride based semiconductor layer is similar in thermal expansion coefficient to the GaN or AlGaN substrate, for which reason almost no residual thermal strain is present in the gallium nitride based semiconductor layer. It is, therefore, easy to stably adjust the compositional fluctuation particularly the microscopic compositional fluctuation. For the above reasons, it is preferable to select gallium nitride based materials or sapphire for the substrate material.

Figure 2:
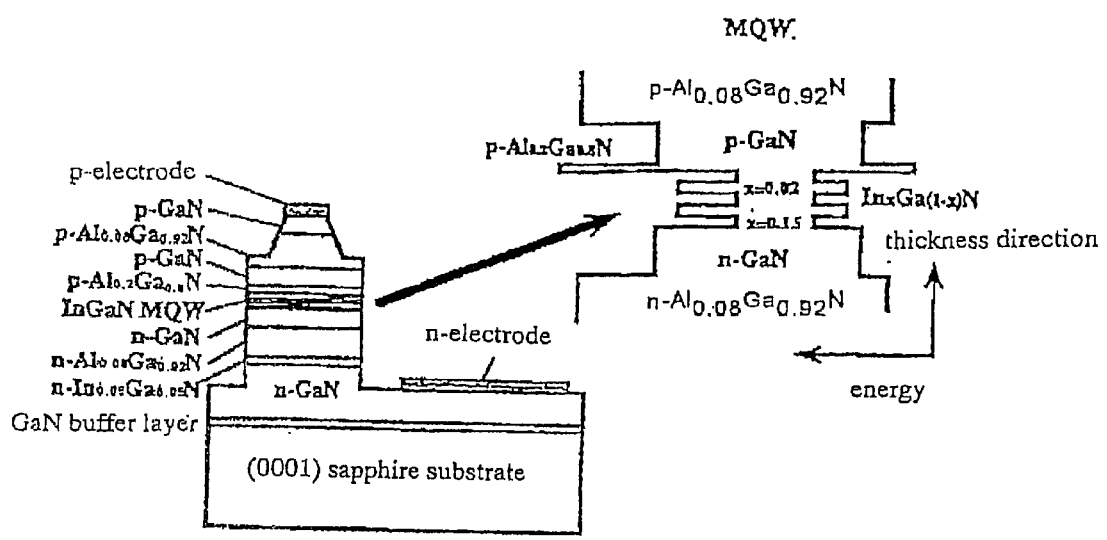
FIG. 2 is a cross sectional elevation view illustrative of a conventional gallium nitride based semiconductor laser diode over sapphire substrate as the first prior art with a diagram illustrative of an energy band gap profile of a multiple quantum well structure provided therein.

The present invention will be compared with the prior arts in view of the fluctuations and the gains. FIG. 2 is illustrative of an energy band gap profile of a multiple quantum well structure provided in a conventional gallium nitride based semiconductor laser diode over sapphire substrate as the first prior art. A GaN buffer layer is provided on the sapphire substrate. An AlGaN cladding layer is provided over the GaN buffer layer. An InGaN quintuple quantum well active layer is provided over the AlGaN cladding layer.

The second and third prior arts relate to the gallium nitride based semiconductor laser diodes provided over the silicon carbide substrates. The second prior art semiconductor laser diode has a photo-luminescence wavelength, distribution of about 150 meV of the active layer in the cavity. The third prior art semiconductor laser diode has a reduced photo-luminescence wavelength distribution of about 90 meV of the active layer in the cavity. The reason for selecting silicon carbide to the substrate material is mentioned in the above Japanese publication as follows. In a short wavelength semiconductor laser diode, sapphire having a large lattice mismatch of 13% to the nitride based compound semiconductor is selected for the growth substrate, for which reason the density of dislocation in the active layer in the cavity is about $1\times10^{10}$ $cm^{-2}$. Notwithstanding, in the nitride based compound semiconductor, the prior art considered that the dislocation does not form non-luminescence center and does not provide any influence to the device performance. The prior arts do not consider the density of the dislocations in the active layer. Actually, however, the dislocation density has an inter-relationship with the compositional non-uniformity. As the dislocation density is decreased, then the compositional non-uniformity is also decreased. The use of the silicon carbide substrate largely reduces the lattice miss-match to about 3%. The large reduction in the lattice miss-match results in a reduction in the dislocation density into not namer than $1\times10^9$ $cm^{-2}$ and at least to about $1\times10^7$ $cm^{-2}$. The short wavelength semiconductor laser diode with the suppressed multiple wavelength emission is realized. The descriptions of this paragraph are of the second and third prior arts.

Figure 6:
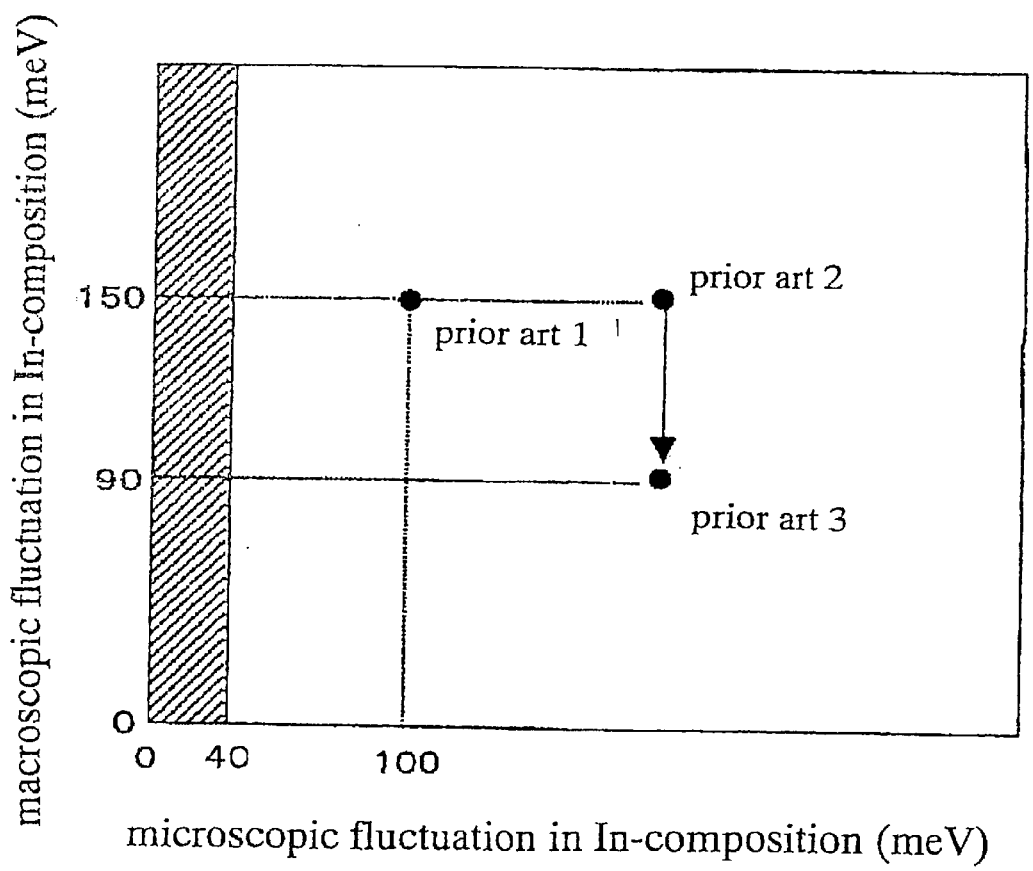
FIG. 6 is a diagram illustrative of relationships between the "macroscopic fluctuation" and "microscopic fluctuation" in the indium composition profile for the present invention, and the first to third prior arts.

FIG. 6 is a diagram illustrative of relationships between the "macroscopic fluctuation" and "microscopic fluctuation" in the indium composition profile for the present invention, and the first to third prior arts. The horizontal axis represents the "microscopic fluctuation" in the indium composition profile in the sub-micron order scale. The vertical axis represents the "macroscopic fluctuation" in the indium composition profile in the order of not less than 1 micrometer. A hatched region represents the present invention. The first to third prior arts have larger "microscopic fluctuation" not less than 100 meV. The first prior art provides a differential gain of $5.8\times10^{-17}$ $cm^2$, which is converted to about 100 meV. By contrast, in the present invention, the "microscopic fluctuation" is not more than 40 meV. The present invention is different from the first to third prior arts in that the "microscopic fluctuation" is reduced to not more than 40 meV and preferably not more than 20 meV.

Figure 7:
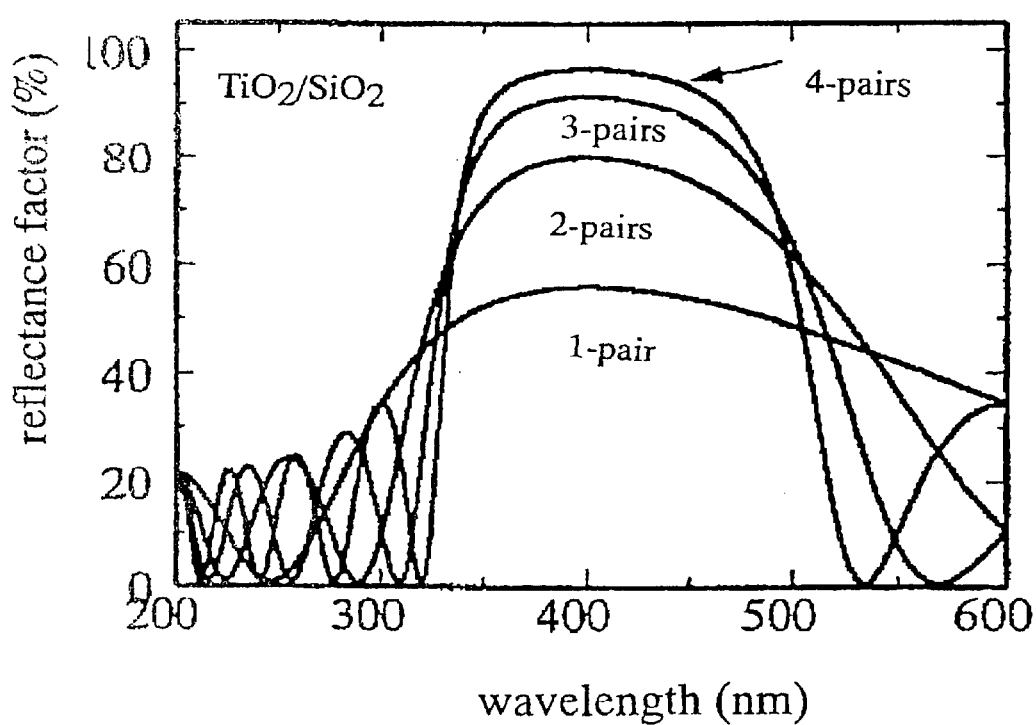
FIG. 7 is a diagram illustrative of reflective spectrums which represent variations in reflectance factor "R" over wavelength, wherein $SiO_2$ films and $TiO_2$ films are alternately laminated by one pair, two pairs, three pairs and four pairs, where the $SiO_2$ films and $TiO_2$ films have a thickness of 100 nanometers.

The following descriptions will focus on the method of measuring the reflectance factor of the semiconductor laser diode. The reflectance factor "R" of the sample laser is given by $R=(n-1/n+1)^2$, where "n" is the refractive index provided that the semiconductor is simply cleaved without coating. It was known that the refractive index of GaN is about 2.553 if the wavelength of the laser beam is 400 nanometers. In this case, the reflectance factor "R" is 19%. A dielectric multilayer structure is used for obtaining a highly reflective mirror, wherein the dielectric multilayer structure comprises alternating laminations of a high refractive index dielectric film and a low refractive index dielectric film. The reflectance factor "R" depends on the individual refractive indexes of the used materials, individual thickness of the films and the number of the laminated films. $TiO_2$ has a refractive index of 2.31. $SiO_2$ has a refractive index of 1.44. FIG. 7 is a diagram illustrative of reflective spectrums which represent variations in reflectance factor "R" over wavelength, wherein $SiO_2$ films and $TiO_2$ films are alternately laminated by one pair, two pairs, threw pairs and four pairs, where the $SiO_2$ films and $TiO_2$ films have a thickness of 100 nanometers. The reflectance factor "R" comes large at a wavelength of about 400 nanometers. The reflectance factor "R" at a wavelength of about 400 nanometers depends on the number of pairs, namely on the number of the laminations. In case of the single pair of the $SiO_2$ film and $TiO_2$ film, the maximum value of the reflectance factor "R" is approximately 50%. In case of the two pair of the $SiO_2$ film and $TiO_2$ film, the maximum value of the reflectance factor "R" is approximately 80%. In case of the three pair of the $SiO_2$ film and $TiO_2$ film, the maximum value of the reflectance factor "R" is approximately 90%. In case of the four pair of the $SiO_2$ film and $TiO_2$ film, the maximum value of the reflectance factor "R" is over 90%. The reflectance factor is calculated from the materials, thicknesses and the number of laminations.

There is another method of measuring the reflectance factor of the highly reflective coating, wherein the semiconductor laser diode is used. First and second outputs P1 and P2 from first and second reflectance factors R1 and R2 of the first and second facets of the semiconductor laser diode have a relationship given by $P1/P2=(1-R1)/(1-R2)\times(R2/R1)^{0.5}$. One of the first and second reflectance factors R1 and R2 is calculated from a ratio of P1/P2 and another of the first and second reflectance factors R1 and R2. If one of the first and second facets is uncoated, then the estimated reflectance factor of the uncoated facet is 19%. This method is effective to calculate the remaining reflectance factor of the coated facet.

Usually, the dielectric multilayer mirror such as alternating laminations of $SiO_2$ film and $TiO_2$ film is used for the highly reflective coat of the nitride based semiconductor laser diode, and the reflectance factor is not less than 80%. If the first and second facets are HR-coated, then a mirror loss is approximated to be 1 $cm^{-1}$. If one of the first and second facets is HR-coated and a cavity length is about 400 micrometers, then a mirror loss is approximated to be 20 $cm^{-1}$.

Preferred Embodiment

First Embodiment

A first embodiment according to the present invention will be described in detail with reference to the drawings. An n-GaN substrate with a low dislocation density was prepared by the above described facet-initiated epitaxial lateral over growth. The prepared substrate was made into contact with a phosphoric acid based solution to form etching-pits. The substrate was then measured in density of the etching-pits for measuring a surface dislocation density. It was confirmed that the measured surface dislocation density is $1.0\times10^7$ $cm^{-2}$.

Figure 8:
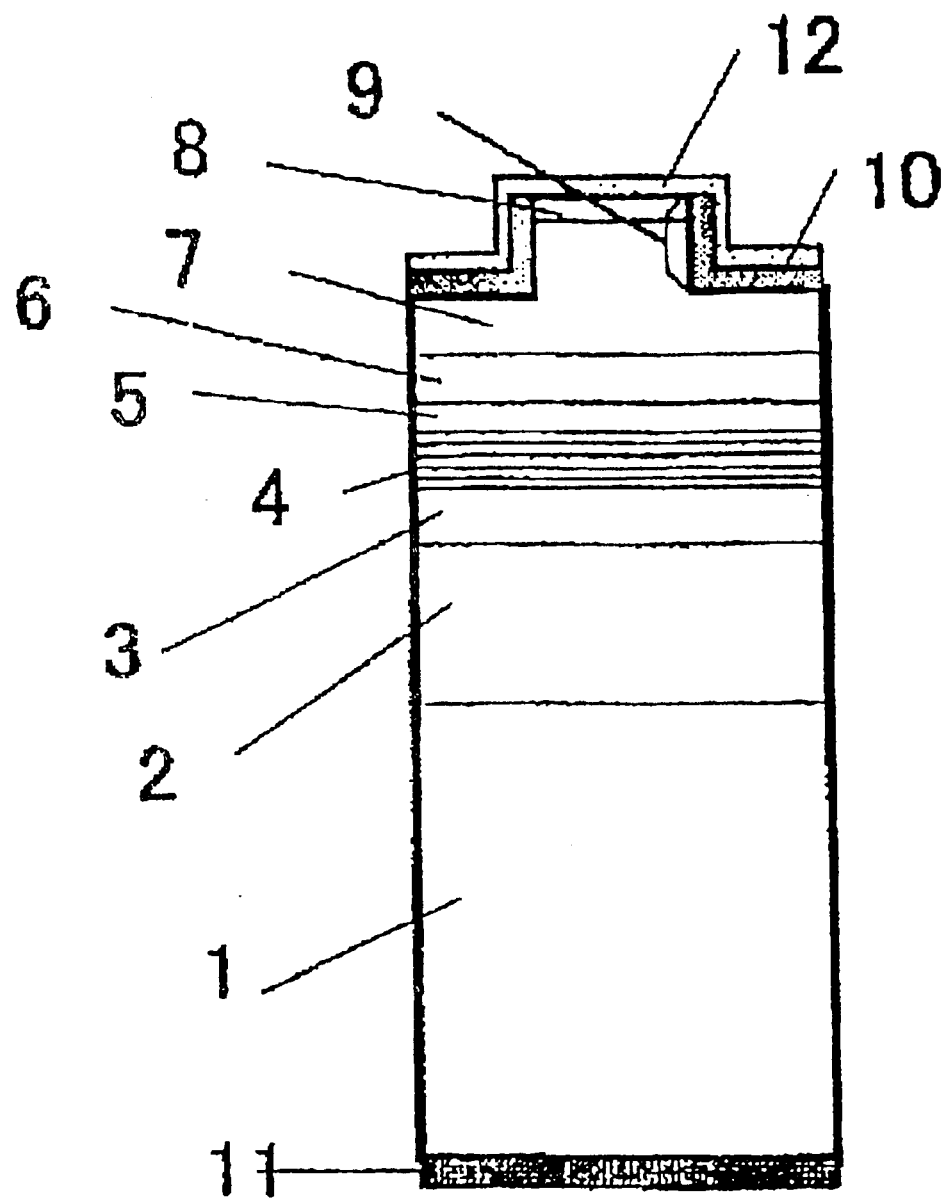
FIG. 8 is a cross sectional elevation view illustrative of a semiconductor laser diode in a first embodiment in accordance with the FIG. 9A is a plane view illustrative of a plane shape of a reactor in at growth system used for forming the individual layers of the semiconductor laser diode of FIG. 8.

This n-GaN substrate with the low surface dislocation density was used for forming a gallium nitride based laser diode. FIG. 8 is a cross sectional elevation view illustrative of a semiconductor laser diode in a first embodiment in accordance with the present invention. An n-type cladding layer 2 is provided on a top surface of the n-GaN substrate 1, wherein the n-type cladding layer 2 comprises an Si-doped n-type $Al_{0.1}Ga_{0.9}N$ layer having a silicon impurity concentration of $4\times10^{17}$ $cm^{-3}$ and a thickness of 1.2 micrometers. An n-type optical confinement layer 3 is provided on a top surface of the n-type cladding layer 2, wherein the n-type optical confinement layer 3 comprises an Si-doped n-type GaN layer having a silicon impurity concentration of $4\times10^{17}$ $cm^{-3}$ and a thickness of 0.1 micrometer. A multiple quantum well layer 4 is provided on a top surface of the n-type optical confinement layer 3, wherein the multiple quantum well layer 4 comprises two $In_{0.2}Ga_{0.8}N$ well layers having a thickness of 4 nanometers and Si-doped $In_{0.05}Ga_{0.95}N$ potential barrier layers having a silicon impurity concentration of $5\times10^{18}$ $cm^{-3}$ and a thickness of 6 micrometers. A cap layer 5 is provided on a top surface of the multiple quantum well layer 4, wherein the cap layer 5 comprises an Mg-doped p-type $Al_{0.2}Ga_{0.8}N$ layer. A p-type optical confinement layer 6 is provided on a top surface of the cap layer 5, wherein the p-type optical confinement layer 6 comprises an Mg-doped p-type GaN layer having a magnesium impurity concentration of $2\times10^{17}$ $cm^{-3}$ and a thickness of 0.1 micrometer. A p-type cladding layer 7 is provided on a top surface of the p-type optical confinement layer 6, wherein the p-type cladding layer 7 comprises an Mg-doped p-type $Al_{0.1}Ga_{0.9}N$ layer having a magnesium impurity concentration of $2\times10^{17}$ $cm^{-3}$ and a thickness of 0.5 micrometers. A p-type contact layer 8 is provided on a top surface of the p-type cladding layer 7, wherein the p-type contact layer 8 comprises an Mg-doped p-type GaN layer having a magnesium impurity concentration of $2\times10^{17}$ $cm^{-3}$ and a thickness of 0.1 micrometer. Those layers 2, 3, 4, 5, 6, 7, and 8 were formed by a low pressure metal organic vapor phase epitaxy method under a pressure of 200 hPa.

Figure 9A:
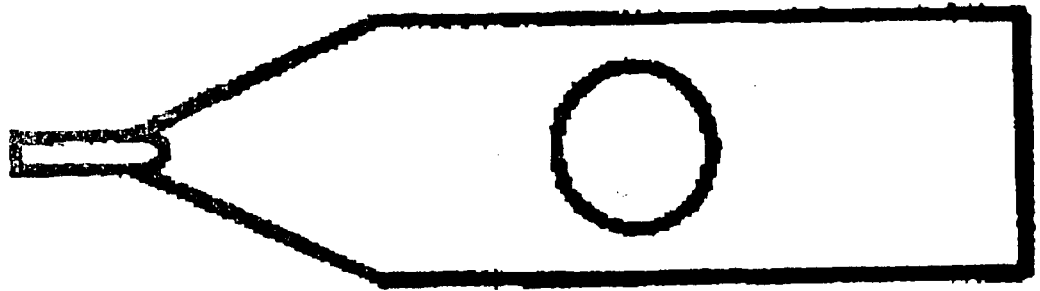
FIG. 9B is a side view illustrative of a side shape of the reactor in the growth system used for forming the individual layers of the semiconductor laser diode of FIG. 8.
Figure 9B:
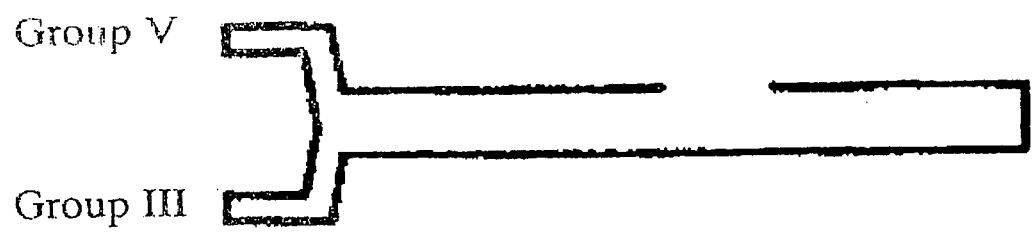

FIG. 9A is a plane view illustrative of a plane shape of a reactor in a growth system used for forming the individual layers of the semiconductor laser diode of FIG. 8. FIG. 9B is a side view illustrative of a side shape of the reactor in the growth system used for forming the individual layers of the semiconductor laser diode of FIG. 8. The reactor is a single streamline flow type reactor, wherein a group III source material and a group V source material are separately introduced via separate lines into the reactor. In FIG. 9B, the group III source material is introduced via the bottom line and the group V source material is introduced via the top line. It is possible as a modification that the group V source material is introduced via the bottom line and the group III source material is introduced via the top line. The substrate is introduced into a circle area of the reactor. A non-illustrated heat is provided directly over the circle area of the reactor.

Figure 10A:
FIG. 10A is a plane view illustrative of a plane shape of another reactor in the growth system used for forming the individual layers of the semiconductor laser diode of FIG. 8.
Figure 10B:
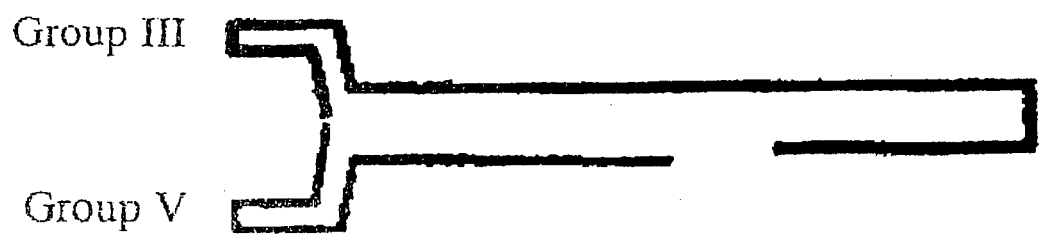
FIG. 10B is a side view illustrative of a side shape of the other reactor in the growth system used for forming the individual layers of the semiconductor laser diode of FIG. 8.

FIG. 10A is a plane view illustrative of a plane shape of another reactor in the growth system used for forming the individual layers of the semiconductor laser diode of FIG. 8. FIG. 10B is a side view illustrative of a side shape of the other reactor in the growth system used for forming the individual layers of the semiconductor laser diode of FIG. 8. The reactor is the single streamline flow type reactor, wherein a group III source material and a group V source material arc separately introduced via separate lines into the reactor. In FIG. 10B, the group III source material is introduced via the top line and the group V source material is introduced via the bottom line. It is possible as a modification that the group V source material is introduced via the top line and the group III source material is introduced via the bottom line. The substrate is introduced into a circle area of the reactor. A non-illustrated heat is provided directly under the circle area of the reactor.

A partial pressure of the ammonium gas for nitrogen source was maintained at 120 hPa except when the InGaN active layer 4 was grown. The partial pressure of the ammonium gas for growing the InGaN active layer 4 was changed. In a sample 1, the partial pressure of the ammonium gas was 147 hPa. In a sample 2, the partial pressure of the ammonium gas was 134 hPa. In a sample 3, the partial pressure of the ammonium gas was 120 hPa. In a sample 4, the partial pressure of the ammonium gas was 107 hPa. In a sample 5, the partial pressure of the ammonium gas was 93 hPa. In a sample 6, the partial pressure of the ammonium gas was 53 hPa. TMG was used for the Ga source material. TMA was used for the Al source material. TMI was used for the In source material. The growth temperature was maintained at 1050° C. except when the InGaN multiple quantum well active layer 4 was grown. In the growth of the InGaN multiple quantum well active layer 4, the growth temperature was maintained at 780° C.

With reference back to FIG. 8, a dry etching process was then carried out to selectively etch the p-type cladding layer 7 and the p-type contact layer 8 thereby forming a mesa structure 9. A silicon dioxide film 10 was formed on the mesa structure 9 and the upper surfaces of the p-type contact layer 8. The silicon dioxide film 10 was selectively removed from the top surface of the mesa structure 9 by use of an exposure technique, whereby the top surface of the p-type contact layer 8 was shown and a ridged structure was formed. An n-type electrode 11 was formed on a bottom surface of the substrate 1, wherein the n-type electrode 11 comprises laminations of a titanium layer and an aluminum layer. A p-type electrode 12 was formed on a top surface of the p-type contact layer 8, wherein the p-type electrode 12 comprises laminations of a nickel layer and a gold layer. The above structure was then cleaved to form first and second facets. The first facet was then coated with a highly reflective coat of a reflectance factor of 95%, wherein the highly reflective coat comprises laminations of titanium dioxide film and silicon dioxide film.

The threshold current density and the threshold voltage were measured for each of the above samples 1–6. In case of the sample 1, the measured threshold current density was 3.8 kA/cm$^2$, and the measured threshold voltage was 4.8V. In case of the sample 2, the measured threshold current density was 3.7 kA/cm$^2$, and the measured threshold voltage was 4.7V In case of the sample 3, the measured threshold current density was 3.7 kA/cm$^2$, and the measured threshold voltage was 4.9V. In case of the sample 4, the measured threshold current density was 3.8 kA/cm$^2$, and the measured threshold voltage was 5.0V. In case of the sample 5, the measured threshold current density was 3.6 kA/cm$^2$, and the measured threshold voltage was 4.7V. In case of the sample 6, the measured threshold current density was 3.8 kA/cm$^2$, and the measured threshold voltage was 4.8V. The threshold current density and the threshold voltage are not so different among the samples 1–6 which are different in the growth conditions as described above. Namely, the threshold current density and the threshold voltage do not depend on the growth conditions.

The measurement was made in the above method to the "microscopic fluctuation" in the band gap energy profile of the luminescent layers comprising the quantum well layers due to the "microscopic fluctuation" in the indium composition profile. In the sample 1, the measured standard deviation of the "microscopic fluctuation" in the band gap energy profile was 82 meV In the sample 2, the measured standard deviation of the "microscopic fluctuation" in the band gap energy profile was 66 meV. In the sample 3, the measured standard deviation of the "microscopic fluctuation" in the band gap energy profile was 52 meV In the sample 4, the measured standard deviation of the "microscopic fluctuation" in the band gap energy profile was 41 meV In the sample 5, the measured standard deviation of the "microscopic fluctuation" in the band gap energy profile was 22 meV. In the sample 6, the measured standard deviation of the "microscopic fluctuation" in the band gap energy profile was 5 meV.

Accordingly, in the sample 1, the measured standard deviation of the "microscopic fluctuation" in the indium composition profile was 0.14. In the sample 2, the measured standard deviation of the "microscopic fluctuation" in the indium composition profile was 0.11. In the sample 3, the measured standard deviation of the "microscopic fluctuation" in the indium composition profile was 0.87. In the sample 4, the measured standard deviation of the "microscopic fluctuation" in the indium composition profile was 0.067. In the sample 5, the measured standard deviation of the "microscopic fluctuation" in the indium composition profile was 0.037. In the sample 6, the measured standard deviation of the "microscopic fluctuation" in the indium composition profile was 0.0083.

Figure 11:
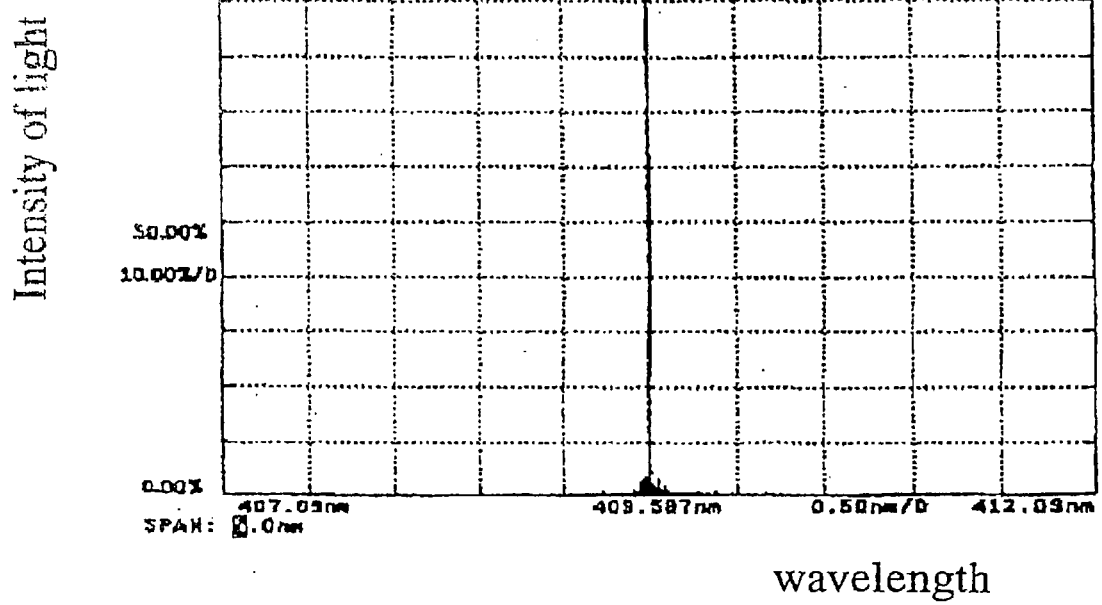
FIG. 11 is a diagram illustrative of a spectrum of a laser beam emitted from the laser diode in each of the samples in this embodiment, wherein a horizontal axis represents a wavelength and a vertical axis represents an intensity of light.

The relaxation frequency was then measured to measure the differential gain. In the sample 1, the measured differential gain was $0.6 \times 10^{-20}$ m$^2$. In the sample 2, the measured differential gain was $0.7 \times 10^{-20}$ m$^2$. In the sample 3, the measured differential gain was $0.8 \times 10^{-20}$ m$^2$. In the sample 4, the measured differential gain was $1.0 \times 10^{-20}$ m$^2$. In the sample 5, the measured differential gain was $1.4 \times 10^{-20}$ m$^2$. In the sample 6, the measured differential gain was $2.2 \times 10^{-20}$ m$^2$. The measured differential gain values almost correspond to the theoretical values shown in FIG. 5. The differential gain was measured by the known technique disclosed on pages 147–154 in the Text Book "semiconductor laser". The micro-photo-luminescence measurement was made with a micro-beam spot of 1 micrometer diameter to the same INGaN active layer as the above samples. The micro-beam spot was moved at a pitch of 1 micrometer throughout a limited squared area of 50 micrometers×50 micrometers. An He—Cd laser beam was used for excitation. In all of the samples 1–6, the distribution of the photo-luminescent peak wavelength was within the range of −1 nanometer to +1 nanometer. Further, the distribution of the photo-luminescent peak wavelength was tilted in a uniform direction in the limited area of 2500 μm$^2$. FIG. 11 is a diagram illustrative of a spectrum of a laser beam emitted from the laser diode in each of the samples in this embodiment, wherein a horizontal axis represents a wavelength and a vertical axis represents an intensity of light. The spectrum was measured with a resolving power of 0.02 nanometers. As shown in FIG. 11, the laser emission appeared in a single vertical mode, wherein the current density was 1.2 times of the threshold current density. It was confirmed that the "macroscopic fluctuation" in the order of not less than 1 micrometer in the indium composition profile is not present in the InGaN amorphous layer grown over the GaN substrate having the low surface dislocation density. This means that the conventional semiconductor laser diodes are free of the "macroscopic fluctuation" in the indium composition in the InGaN quantum well layers in the photo-luminescence measurement with the resolving power of 1 micrometers, notwithstanding the conventional semiconductor laser diodes have the "microscopic fluctuations" in the sub-micron order scale. It is presumable that the differential gain mainly depends on the "microscopic fluctuation" of the smaller scale than the diffusion length of the carriers.

Figure 12:
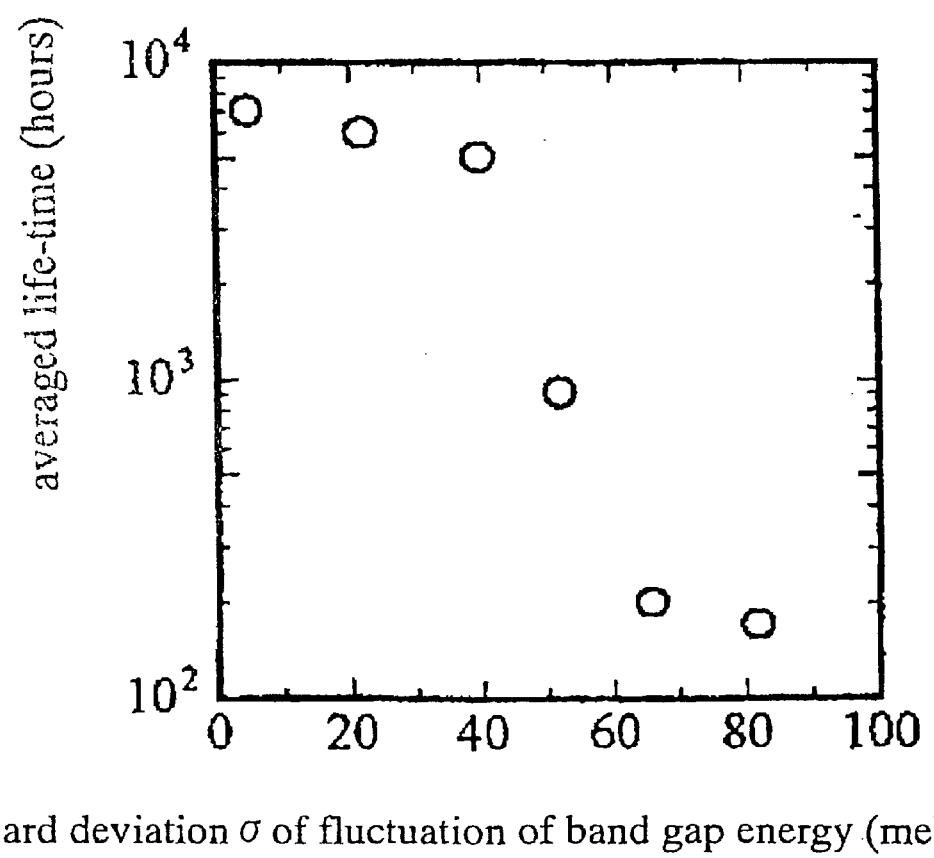
FIG. 12 is a diagram illustrative of a relationship between the averaged life-time of the device over the standard deviation of the "microscopic fluctuations" in the sub-micron order scale in the band gap energy profile of the quantum well layers of the laser diodes in the samples 1–6.

FIG. 12 is a diagram illustrative of a relationship between the averaged life-time of the device over the standard deviation of the "microscopic fluctuations" in the sub-micron order scale in the band gap energy profile of the quantum well layers of the laser diodes in the samples 1–6. The life-time of each of the samples 1–6 was measured by APC examination under high temperature and high output conditions, for example at 70° C. and 30 mW. The life-time under the high temperature and high output conditions is highly sensitive to the "microscopic fluctuations" in the sub-micron order scale in the band gap energy profile. As the standard deviation of the "microscopic fluctuations" in the sub-micron order scale in the band gap energy profile is higher than 60 meV, then the life-time is short. As the standard deviation of the "microscopic fluctuations" in the sub-micron order scale in the band gap energy profile is decreased from 60 meV to 40 meV, then the life-time is rapidly increased to 5000 hours. If the "microscopic fluctuations" in the sub-micron order scale in the band gap energy profile is large, local strains are formed in the photo-luminescent layer. The local strains allow defects to be formed in the photo-luminescent layer due to thermal energy, and photon and carrier energies. Once the defects are formed, non-luminescent recombination of carriers appear at the defects, whereby local heat generations are caused at the defects. The heat generations further cause new defects. If the "microscopic fluctuations" in the sub-micron order scale in the band gap energy profile is small, no local strains are formed in the photo-luminescent layer. No local strains results in no formation of defects in the photo-luminescent layer even upon receipt thermal energy, and photon and carrier energies.

Comparative Example 1

In pace of the n-GaN substrate 1 having the low surface dislocation density, a sapphire substrate was used which has a high surface dislocation density of not less than $5 \times 10^8$ $cm^{-2}$. A low temperature buffer layer was formed on the sapphire substrate at a low temperature condition at 500° C. The same multilayer structure as in the first embodiment was formed over the buffer layer in the same processes as in the first embodiment to form the semiconductor laser diode with the sapphire substrate. No improvement in the life-time was confirmed.

The fluctuation of the band gap energy of the semiconductor laser diode was measured. Independent from the growth conditions, the standard deviation of the fluctuation of the band gap energy was within 80 meV ±5 meV. It is presumable that no change in the fluctuation of the band gap energy causes no improvement in the life-time of the device.

With comparing the first embodiment to the comparative example 1, the inter-relationship between the device life-time and the fluctuation of the indium composition profile was confirmed. In the above embodiment and the comparative example 1, the indium composition profile was obtained by adjusting the indium gas partial pressure. Any other a method may be used for controlling the indium composition profile.

Second Embodiment

A second embodiment according to the present invention will be described in detail with reference to the drawings. An n-GaN substrate with a low dislocation density was prepared by the above described facet-initiated epitaxial lateral over growth. The prepared substrate was made into contact with a phosphoric acid based solution to form etching-pits. The substrate was then measured in density of the etching-pits for measuring a surface dislocation density. It was confirmed that the measured surface dislocation density is $1.0 \times 10^7$ $cm^{-2}$.

Figure 13:
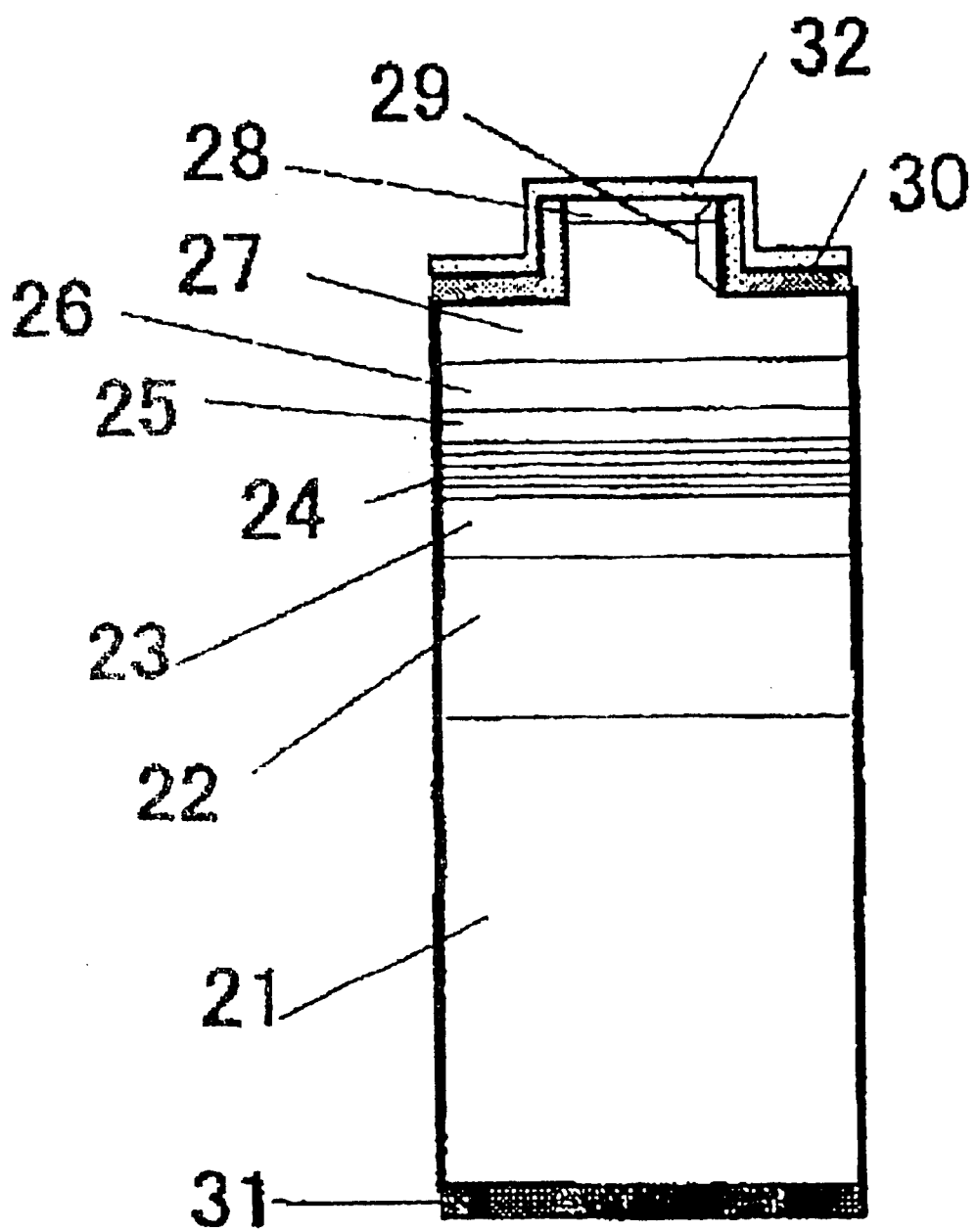
FIG. 13 is a cross sectional elevation view illustrative of a semiconductor laser diode in a second embodiment in accordance with the present invention.

This n-GaN substrate with the low surface dislocation density was used for forming a gallium nitride based laser diode. FIG. 13 is a cross sectional elevation view illustrative of a semiconductor laser diode in a second embodiment in accordance with the present invention. An n-type cladding layer 22 is provided on a top surface of the n-GaN substrate 21, wherein the n-type cladding layer 22 comprises an Si-doped n-type $Al_{0.1}Ga_{0.9}N$ layer having a silicon impurity concentration of $4 \times 10^{17}$ $cm^{-3}$ and a thickness of 1.2 micrometers. An n-type optical confinement layer 23 is provided on a top surface of the n-type cladding layer 22, wherein the n-type optical confinement layer 33 comprises an Si-doped n-type GaN layer having a silicon impurity concentration of $4 \times 10^{17}$ $cm^{-3}$ and a thickness of 0.1 micrometer. A multiple quantum well layer 24 is provided on a top surface of the n-type optical confinement layer 23, wherein the multiple quantum well layer 24 comprises two $Al_{0.01}In_{0.2}Ga_{0.79}N$ well layers having a thickness of 4 nanometers and Si-doped $Al_{0.01}In_{0.05}Ga_{0.94}N$ potential barrier layers having a silicon impurity concentration of $5 \times 10^{18}$ $cm^{-3}$ and a thickness of 6 micrometers. A cap layer 25 is provided on a top surface of the multiple quantum well layer 24, wherein the cap layer 25 comprises an Mg-doped p-type $Al_{0.2}Ga_{0.8}N$ layer. A p-type optical confinement layer 26 is provided on a top surface of the cap layer 25, wherein the p-type optical confinement layer 26 comprises an Mg-doped p-type GaN layer having a magnesium impurity concentration of $2 \times 10^{17}$ $cm^{-3}$ and a thickness of 0.1 micrometer. A p-type cladding layer 27 is provided on a top surface of the p-type optical confinement layer 26, wherein the p-type cladding layer 27 comprises an Mg-doped p-type $Al_{0.1}Ga_{0.9}N$ layer having a magnesium impurity concentration of $2 \times 10^{17}$ $cm^{-3}$ and a thickness of 0.5 micrometers. A p-type contact layer 28 is provided on a top surface of the p-type cladding layer 27, wherein the p-type contact layer 28 comprises an Mg-doped p-type GaN layer having a magnesium impurity concentration of $2 \times 10^{17}$ $cm^{-3}$ and a thickness of 0.1 micrometer. Those layers 22, 23, 24, 25, 26, 27, and 28 were formed by a low pressure metal organic vapor phase epitaxy method under a pressure of 200 hPa. A partial pressure of the ammonium gas for nitrogen source was maintained at 120 hPa except when the AlInGaN active layer 24 was grown. The partial pressure of the ammonium gas for growing the AlInGaN active layer 24 was changed. In a sample 7, the partial pressure of the ammonium gas was 147 hPa. In a sample 8, the partial pressure of the ammonium gas was 134 hPa. In a sample 9, the partial pressure of the ammonium gas was 120 hPa. In a sample 10, the partial pressure of the ammonium gas was 107 hPa. In a sample 11, the partial pressure of the ammonium gas was 93 hPa. In a sample 12, the partial pressure of the ammonium gas was 53 hPa. TMG was used for the Ga source material. TMA was used for the Al source material. TMI was used for the In source material The growth temperature was maintained at 1050° C. except when the AlInGaN multiple quantum well active layer 24 was grown. In the growth of the AlInGaN multiple quantum well active layer 24, the growth temperature was maintained at 780° C.

A dry etching process was then carried out to selectively etch the p-type cladding layer 27 and the p-type contact layer 28 thereby forming a mesa structure 29. A silicon dioxide film 30 was formed on the mesa structure 29 and the upper surfaces of the p-type contact layer 28. The silicon dioxide film 30 was selectively removed from the top surface of the mesa structure 29 by use of an exposure technique, whereby the top surface of the p-type contact layer 28 was shown and a ridged structure was formed. An n-type electrode 31 was formed on a bottom surface of the substrate 21, wherein the n-type electrode 31 comprises laminations of a titanium layer and an aluminum layer. A p-type electrode 32 was formed on a top surface of the p-type contact layer 28, wherein the p-type electrode 32 comprises laminations of a nickel layer and a gold layer. The above structure was then cleaved to form first and second facets. The first facet was then coated with a highly reflective coat of a reflectance factor of 95%, wherein the highly reflective coat comprises laminations of titanium dioxide film and silicon dioxide film.

The threshold current density and the threshold voltage were measured for each of the above samples 7–12. The threshold current density and the threshold voltage are not so different among the samples 7–12 which are different in the growth conditions as described above. Namely, the threshold current density and the threshold voltage do not depend on the growth conditions.

The measurement was made in the above method to the "microscopic fluctuation" in the band gap energy profile of the luminescent layers comprising the quantum well layers due to the "microscopic fluctuation." in the indium composition profile. In the samples 10–12, the measured standard deviation of the "microscopic fluctuation" in the band gap energy profile was not more than 40 meV Accordingly, in the samples 10–12, the measured standard deviation of the "microscopic fluctuation" in the indium composition profile was not more than 0.067.

The relaxation frequency was then measured to measure the differential gain. In the samples 10–12, the measured differential gain was not less than $1.0 \times 10^{-20}$ m$^2$.

The life-time of each of the samples 10–12 was measured by APC examination under high temperature and high output conditions, for example, at 70° C. and 30 mW. The life-time under the high temperature and high (output conditions is highly sensitive to the "microscopic fluctuations" in the sub-micron order scale in the band gap energy profile. As the standard deviation of the "microscopic fluctuations" in the sub-micron order scale in the band gap energy profile is not more than 40 meV, then the life-time is not less than 5000 hours. If the "microscopic fluctuations" in the sub-micron order scale in the band gap energy profile is large, local strains are formed in the photo-luminescent layer. The local strains allow defects to be formed in the photo-luminescent layer due to thermal energy, and photon and carrier energies. Once the defects are formed, non-luminescent recombination of carriers appear at the defects, whereby local heat generations are caused at the defects. The heat generations further cause new defects. If the "microscopic fluctuations" in the sub-micron order scale in the band gap energy profile is small, no local strains are formed in the photo-luminescent layer. No local strains results in no formation of defects in the photo-luminescent layer even upon receipt thermal energy, and photon and carrier energies.

In this second embodiment, the multiple quantum well active layer 24 are made of quaternary compound semiconductors of AlInGaN. The improvement in the life-time was also confirmed because the effective compositional fluctuation for the life-time are the indium composition fluctuation.

Comparative Example 2

The semiconductor laser diode was formed, provided that the ammonium gas partial pressure was maintained at 147 hPa for growing the InGaN active layer. The "macroscopic fluctuation" in the indium composition profile was measured by the micro-photo-luminescence measurement with the resolving power of 1 micrometer. It was confirmed that the photo-luminescent wavelength distribution was not more than 20 meV.

Further, the "microscopic fluctuation" in the indium composition profile was measured by the relaxation frequency measurement which measures the differential gain. It was confirmed that the "microscopic fluctuation" was 82 meV.

Figure 14:
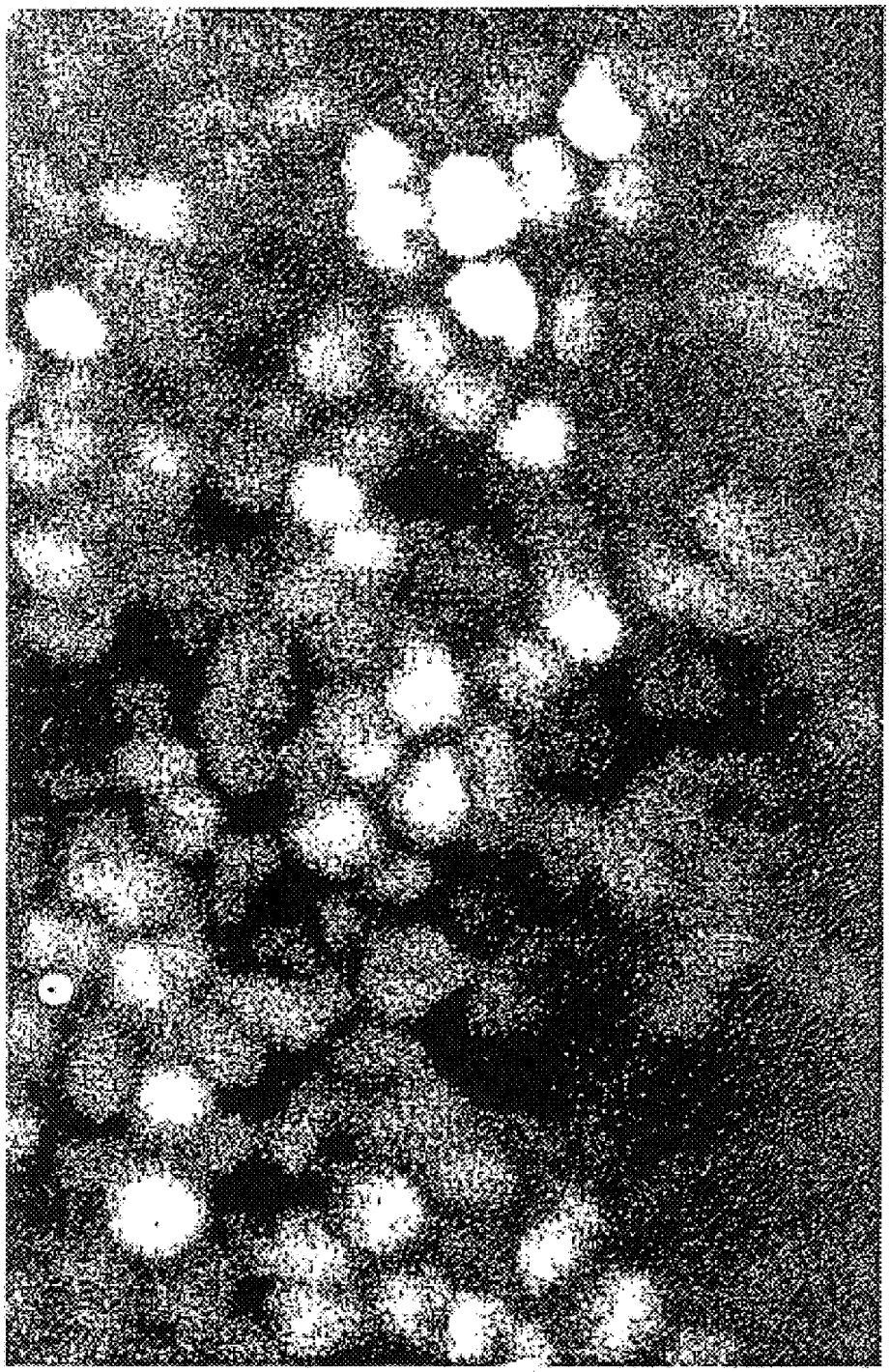
FIG. 14 is a photograph of the cathode luminescence image.

Furthermore, the "microscopic fluctuation" in the indium composition profile was measured by observation of cathode luminescence. In the cathode luminescence observation, after the cap layer was formed over the multiple quantum well active layer, the growth process was discontinued to form samples. Electron beams are irradiated onto the samples with concurrent spectroscope for conducting mapping process at a predetermined wavelength, at an acceleration voltage of 3 kV and at room temperature. It was confirmed that the cathode luminescence was observed in the range of 400–500 nanometers. FIG. 14 is a photograph of the cathode luminescence image. As a result, it was confirmed that the samples of this comparative example 2 are free of the "macroscopic fluctuation" but have the "microscopic fluctuation".

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device comprising:
   a base layer made of a gallium nitride-based material;
   a cladding layer extending over said base layer; and
   an active layer extending over said cladding layer, and said active layer including at least a photo-luminescent layer of In$_x$Al$_y$Ga$_{1-x-y}$N (0<x<1, 0≦y≦0.2),
   wherein a standard deviation Δx of a microscopic fluctuation in an indium composition of said photo-luminescent layer is not more than 0.067.

2. The semiconductor device as claimed in claim 1, wherein said standard deviation Δx of said microscopic fluctuation in said indium composition of said photo-luminescent layer is not more than 0.04.

3. The semiconductor device as claimed in claim 1, wherein a standard deviation σ of a microscopic fluctuation in a band gap energy of said photo-luminescent layer is not more than 40 meV.

4. The semiconductor device as claimed in claim 3, wherein said standard deviation σ of said microscopic fluctuation in said band gap energy of said photo-luminescent layer is not more than 30 meV.

5. The semiconductor device as claimed in claim 1, wherein a differential gain "dg/dn" of said active layer satisfies dg/dn≧$1.0 \times 10^{-20}$ (m$^2$).

6. The semiconductor device as claimed in claim 5, wherein said differential gain "dg/dn" of said active layer satisfies dg/dn≧$1.4 \times 10^{-20}$ (m$^2$).

7. The semiconductor device as claimed in claim 1, wherein a surface dislocation density of a top surface of said base layer is less than $1 \times 10^8$ cm$^{-2}$.

8. The semiconductor device as claimed in claim 1, wherein a surface dislocation density of an interface between said cladding layer and said active layer is less than $1 \times 10^8$ cm$^{-2}$.

9. The semiconductor device as claimed in claim 1, wherein a photo-luminescence peak wavelength distribution is not more than 40 meV.

10. The semiconductor device as claimed in claim 9, wherein said photo-luminescence peak wavelength distribution is not more than 20 meV.

11. The semiconductor device as claimed in claim 1, wherein said at least photo-luminescent layer comprises In$_x$Al$_y$Ga$_{1-x-y}$N (0<x≦0.3, 0≦y≦0.05).

12. The semiconductor device as claimed in claim 1, wherein said cladding layer has a gallium nitride based material having a lower refractive index than said active layer.

13. The semiconductor device as claimed in claim 1, wherein said base layer extends over a substrate.

14. The semiconductor device as claimed in claim 13, wherein said base layer comprises one selected from the group consisting of GaN and AlGaN, and said cladding layer comprises AlGaN having an aluminum index of not less than 0.05.

15. The semiconductor device as claimed in claim 14, wherein a thickness of said base layer is not less than 1 micrometer.

16. The semiconductor device as claimed in claim 1, wherein said base layer comprises a substrate of a gallium nitride based material.

17. A semiconductor device comprising:
  a base layer made of a gallium nitride-based material;
  a cladding layer extending over said base layer; and
  an active layer extending over said cladding layer, and said active layer including at least a photo-luminescent layer of $In_xAl_yGa_{1-x-y}N$ (0<x<1, 0≦y≦0.2),
  wherein a standard deviation σ of a microscopic fluctuation in a band gap energy of said photo-luminescent layer is not more than 40 meV.

18. The semiconductor device as claimed in claim 17, wherein said standard deviation σ of said microscopic fluctuation in said band gap energy of said photo-luminescent layer is not more than 30 meV.

19. The semiconductor device as claimed in claim 17, wherein a standard deviation Δx of a microscopic fluctuation in an indium composition of said photo-luminescent layer is not more than 0.067.

20. The semiconductor device as claimed in claim 19, wherein said standard deviation Δx of said microscopic fluctuation in said indium composition of said photo-luminescent layer is not more than 0.04.

21. The semiconductor device as claimed in claim 17, wherein a differential gain "dg/dn" of said active layer satisfies dg/dn≧$1.0\times10^{-20}$ ($m^2$).

22. The semiconductor device as claimed in claim 21, wherein said differential gain "dg/dn" of said active layer satisfies dg/dn≧$1.4\times10^{-20}$ ($m^2$).

23. The semiconductor device as claimed in claim 17, wherein a surface dislocation density of a top surface of said base layer is less than $1\times10^8$ $cm^{-2}$.

24. The semiconductor device as claimed in claim 17, wherein a surface dislocation density of an interface between said cladding layer and said active layer is less than $1\times10^8$ $cm^{-2}$.

25. The semiconductor device as claimed in claim 17, wherein a photo-luminescence peak wavelength distribution is not more than 40 meV.

26. The semiconductor device as claimed in claim 25, wherein said photo-luminescence peak wavelength distribution is not more than 20 meV.

27. The semiconductor device as claimed in claim 17, wherein said at least photo-luminescent layer comprises $In_xAl_yGa_{1-x-y}N$(0<x≦0.3, 0≦y≦0.05).

28. The semiconductor device as claimed in claim 17, wherein said cladding layer has a gallium nitride based material having a lower refractive index than said active layer.

29. The semiconductor device as claimed in claim 17, wherein said base layer extends over a substrate.

30. The semiconductor device as claimed in claim 29, wherein said base layer comprises one selected from the group consisting of GaN and AlGaN, and said cladding layer comprises AlGaN having an aluminum index of not less than 0.05.

31. The semiconductor device as claimed in claim 30, wherein a thickness of said base layer is not less than 1 micrometer.

32. The semiconductor device as claimed in claim 17, wherein said base layer comprises a substrate of a gallium nitride based material.

33. A semiconductor device comprising:
  a base layer made of a gallium nitride-based material;
  a cladding layer extending over said base layer; and
  an active layer extending over said cladding layer, and said active layer including at least a photo-luminescent layer of $In_xAl_yGa_{1-x-y}N$ (0<x<1, 0≦y≦0.2),
  wherein a differential gain "dg/dn" of said active layer satisfies dg/dn≧$1.0\times10^{-20}$ ($m^2$).

34. The semiconductor device as claimed in claim 33, wherein said differential gain "dg/dn" of said active layer satisfies dg/dn≧$1.4\times10^{-20}$ ($m^2$).

35. The semiconductor device as claimed in claim 33, wherein a standard deviation σ of a microscopic fluctuation in a band gap energy of said photo-luminescent layer is not more than 40 meV.

36. The semiconductor device as claimed in claim 35, wherein said standard deviation σ of said microscopic fluctuation in said band gap energy of said photo-luminescent layer is not more than 30 meV.

37. The semiconductor device as claimed in claim 33, wherein a standard deviation Δx of a microscopic fluctuation in an indium composition of said photo-luminescent layer is not more than 0.067.

38. The semiconductor device as claimed in claim 37, wherein said standard deviation Δx of said microscopic fluctuation in said indium composition of said photo-luminescent layer is not more than 0.04.

39. The semiconductor device as claimed in claim 33, wherein a surface dislocation density of a top surface of said base layer is less than $1\times10^8$ $cm^{-2}$.

40. The semiconductor device as claimed in claim 33, wherein a surface dislocation density of an interface between said cladding layer and said active layer is less than $1\times10^8$ $cm^{-2}$.

41. The semiconductor device as claimed in claim 33, wherein a photo-luminescence peak wavelength distribution is not more than 40 meV.

42. The semiconductor device as claimed in claim 41, wherein said photo-luminescence peak wavelength distribution is not more than 20 meV.

43. The semiconductor device as claimed in claim 33, wherein said at least photo-luminescent layer comprises $In_xAl_yGa_{1-x-y}N$ (0<x≦0.3, 0≦y≦0.05).

44. The semiconductor device as claimed in claim 33, wherein said cladding layer has a gallium nitride based material having a lower refractive index than said active layer.

45. The semiconductor device as claimed in claim 33, wherein said base layer extends over a substrate.

46. The semiconductor device as claimed in claim 45, wherein said base layer comprises one selected from the group consisting of GaN and AlGaN, and said cladding layer comprises AlGaN having an aluminum index of not less than 0.05.

47. The semiconductor device as claimed in claim 46, wherein a thickness of said base layer is not less than 1 micrometer.

48. The semiconductor device as claimed in claim 33, wherein said base layer comprises a substrate of a gallium nitride based material.

49. A layered structure comprising: an active layer including at least a first layer of $In_xAl_yGa_{1-x-y}N$ (0<x<1, 0≦y≦0.2),
  wherein a standard deviation Δx of a microscopic fluctuation in an indium composition of said photo-luminescent layer is not more than 0.067.

50. The layered structure as claimed in claim 49, wherein said standard deviation Δx of said microscopic fluctuation in said indium composition of said photo-luminescent layer is not more than 0.04.

51. The layered structure as claimed in claim 49, wherein a standard deviation σ of a microscopic fluctuation in a band gap energy of said photo-luminescent layer is not more than 40 meV.

52. The layered structure as claimed in claim 51, wherein said standard deviation σ of said microscopic fluctuation in said band gap energy of said photo-luminescent layer is not more than 30 meV.

53. The layered structure as claimed in claim 49, wherein a surface dislocation density of a bottom surface of said first layer is less than $1 \times 10^8$ cm$^{-2}$.

54. The layered structure as claimed in claim 49, wherein a photo-luminescence peak wavelength distribution is not more than 40 meV.

55. The layered structure as claimed in claim 54, wherein said photo-luminescence peak wavelength distribution is not more than 20 meV.

56. The layered structure as claimed in claim 49, wherein said at least photo-luminescent layer comprises $In_xAl_yGa_{1-x-y}N$ (0<x≦0.3, 0≦y<0.05).

57. A layered structure comprising: an active layer including at least a first layer of $In_xAl_yGa_{1-x-y}N$ (0<x<1, 0≦y≦0.2),
wherein a standard deviation σ of a microscopic fluctuation in a band gap energy of said photo-luminescent layer is not more than 40 meV.

58. The layered structure as claimed in claim 57, wherein said standard deviation σ of said microscopic fluctuation in said band gap energy of said photo-luminescent layer is not more than 30 meV.

59. The layered structure as claimed in claim 57, wherein a standard deviation Δx of a microscopic fluctuation in an indium composition of said photo-luminescent layer is not more than 0.067.

60. The layered structure as claimed in claim 59, wherein said standard deviation Δx of said microscopic fluctuation in said indium composition of said photo-luminescent layer is not more than 0.04.

61. The layered structure as claimed in claim 57, wherein a surface dislocation density of a bottom surface of said first layer is less than $1 \times 10^8$ cm$^{-2}$.

62. The layered structure as claimed in claim 57, wherein a photo-luminescence peak wavelength distribution is not more than 40 meV.

63. The layered structure as claimed in claim 62, wherein said photo-luminescence peak wavelength distribution is not more than 20 meV.

64. The layered structure as claimed in claim 57, wherein said at least photo-luminescent layer comprises $In_xAl_yGa_{1-x-y}N$ (0<x≦0.3, 0≦y≦0.05).

* * * * *